(12) United States Patent
Horiguchi et al.

(10) Patent No.: US 8,085,566 B2
(45) Date of Patent: *Dec. 27, 2011

(54) SEMICONDUCTOR CIRCUIT DEVICE AND DATA PROCESSING SYSTEM

(75) Inventors: Masashi Horiguchi, Koganei (JP); Mitsuru Hiraki, Kodaira (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/926,516

(22) Filed: Nov. 23, 2010

(65) Prior Publication Data

US 2011/0115461 A1    May 19, 2011

Related U.S. Application Data

(60) Continuation of application No. 12/654,718, filed on Dec. 30, 2009, now Pat. No. 7,876,589, which is a continuation of application No. 12/068,607, filed on Feb. 8, 2008, now Pat. No. 7,663,897, which is a division of application No. 10/940,379, filed on Sep. 14, 2004, now Pat. No. 7,345,461.

(30) Foreign Application Priority Data

Oct. 27, 2003 (JP) .................................. 2003-365430

(51) Int. Cl.
*H02M 1/00* (2007.01)
*H02M 3/06* (2007.01)
*G05F 1/40* (2006.01)

(52) U.S. Cl. ........... 363/147; 323/288; 307/110; 363/62

(58) Field of Classification Search ..................... 363/62, 363/65, 147; 323/282, 288; 307/110, 115
See application file for complete search history.

(56) References Cited

U.S. PATENT DOCUMENTS 4,642,556 A    2/1987 Pecukonis
(Continued)

FOREIGN PATENT DOCUMENTS

CN    1182973 A    5/1998
(Continued)

OTHER PUBLICATIONS

Office Action from the Taiwan, Republic of China Patent Office dated Oct. 21, 2010.

*Primary Examiner* — Jessica Han
(74) *Attorney, Agent, or Firm* — Stites & Harbison PLLC; Juan Carlos A. Marquez, Esq.

(57) ABSTRACT

Occurrence of power supply noise arising in connection with a step-down action at the time of turning on power supply is to be restrained. A step-down unit is provided with a switched capacitor type step-down circuit and a series regulator type step-down circuit, and stepped-down voltage output terminals of the step-down circuits are connected in common. The common connection of the stepped-down voltage output terminals of both step-down circuits makes possible parallel driving of both, selective driving of either or consecutive driving of the two. In the consecutive driving, even if the switched capacitor type step-down circuit is driven after driving the series regulator type step-down circuit first to supply a stepped-down voltage to loads, the switched capacitor type step-down circuit will need only to be compensated for a discharge due to the loads, and a peak of a charge current for capacitors can be kept low. When operation of the switched capacitor type step-down circuit is started, no large rush current arises, and occurrence of noise is restrained.

7 Claims, 30 Drawing Sheets

U.S. PATENT DOCUMENTS

| | | |
|---|---|---|
| 5,229,761 A | 7/1993 | Fuse |
| 5,587,894 A | 12/1996 | Naruo |
| 5,604,383 A | 2/1997 | Matsuzaki |
| 5,717,318 A | 2/1998 | Matsuda et al. |
| 5,847,951 A | 12/1998 | Brown et al. |
| 6,512,411 B2 | 1/2003 | Meng et al. |
| 6,650,555 B2 | 11/2003 | Suzuki et al. |
| 6,654,263 B2 | 11/2003 | Kurotsu |
| 6,940,189 B2 | 9/2005 | Gizara |
| 7,009,858 B2 | 3/2006 | Umeda et al. |
| 7,345,461 B2 * | 3/2008 | Horiguchi et al. ............ 323/284 |
| 7,663,897 B2 * | 2/2010 | Horiguchi et al. .............. 363/62 |
| 7,876,589 B2 * | 1/2011 | Horiguchi et al. ............ 363/147 |
| 2002/0167827 A1 | 11/2002 | Umeda et al. |

FOREIGN PATENT DOCUMENTS

| | | |
|---|---|---|
| JP | 2002-325431 | 11/2002 |
| JP | 2002-369552 | 12/2002 |

\* cited by examiner

SEMICONDUCTOR CIRCUIT DEVICE AND DATA PROCESSING SYSTEM

CROSS-REFERENCE TO RELATED APPLICATION

This application is a Continuation of U.S. patent application Ser. No. 12/654,718 filed on Dec. 30, 2009, now U.S. Pat. No. 7,876,589 which is a Continuation of U.S. patent application Ser. No. 12/068,607 filed on Feb. 8, 2008, now U.S. Pat. No. 7,663,897 which is a Divisional of U.S. patent application Ser. No. 10/940,379, filed Sep. 14, 2004 now U.S. Pat. No. 7,345,461. Priority is claimed based on U.S. patent application Ser. No. 12/654,718 filed on Dec. 30, 2009 which is a Continuation of U.S. patent application Ser. No. 12/068,607 filed on Feb. 8, 2008, which claims priority to U.S. patent application Ser. No. 10/940,379, filed Sep. 14, 2004, which claims priority to Japanese Patent Application No. 2003-365430 filed on Oct. 27, 2003, and which is hereby incorporated by reference.

BACKGROUND OF THE INVENTION

The present invention relates to a semiconductor circuit device having a step-down circuit, and more particularly to a semiconductor circuit device having a switched capacitor type step-down circuit, and further to a semiconductor circuit device having a switched capacitor type step-down circuit and a series regulator type step-down circuit, involving for instance a technique effectively applicable to a microcomputer for a portable communication terminal device or a system-on-chip semiconductor circuit device (system LSI).

On-chip step-down circuits for semiconductor circuit devices include series regulator type step-down circuits. As a series regulator type step-down circuit steps down the voltage by the turning-on resistance of a transistor, as much power is lost as the voltage is stepped down. More efficient arrangements than series type circuits in power conversion include switching regulator type step-down circuits (FIG. 1 in Patent Reference 2). As a switching regulator type step-down circuit requires an inductor as an external unit, it entails problems in mounting space and cost. Step-down circuits needing no inductor and yet excelling in power conversion efficiency include switched capacitor type step-down circuits (FIG. 9 in Reference 2). Further, FIG. 1 in Patent Reference 1 illustrates a circuit configuration in which a switched capacitor type step-down circuit is connected to a series regulator type step-down circuit in series, and a stepped-down voltage supplied from the series regulator type step-down circuit is received and further stepped down by a switched capacitor type step-down circuit.

[Patent Reference 1] Japanese Unexamined Patent Publication No. 2002-325431

[Patent Reference 2] Japanese Unexamined Patent Publication No. 2002-369552

SUMMARY OF THE INVENTION

The present inventors studied the possibility of working out a switched capacitor type step-down circuit needing no inductor and yet excelling in power conversion efficiency as a step-down circuit for LSIs and the like for use in portable equipment. Through the study, the inventors found a problem that the switched capacitor type step-down circuit involved a high power supply current (rush current) especially at the time of turning on power supply. In order to enhance its power efficiency, it is desirable for the switched capacitor type step-down circuit to be designed to minimize the on-resistance of the switch. However, this would result in the flow of a high power supply current at the time of charging the capacitors. Especially at the time of turning on power supply, as the capacitors begin to be charged in a completely uncharged state, it entails a problem of the flow of a high rush current. This would give rise to power supply noise, electromagnetic interference (EMI) and the like.

An object of the present invention is to provide a semiconductor circuit device capable of reducing power consumption accompanying step-down operation.

Another object of the present invention is to provide a semiconductor circuit device capable of preventing or reducing the occurrence of power supply noise accompanying step-down operation at the time of turning on power supply.

Still another object of the present invention is to contribute to reducing power consumption by battery-powered data processing systems.

The above-described and other objects and novel features of the present invention will become apparent from the following description in this specification when taken in conjunction with the accompanying drawings.

Typical aspects of the present invention disclosed in the present application will be briefly described below.

[1] A semiconductor circuit device has a step-down unit for generating a stepped-down voltage by stepping down an external source voltage, wherein the step-down unit is provided with a switched capacitor type step-down circuit and a series regulator type step-down circuit, and the stepped-down voltage output terminals of the step-down circuits are connected in common. The common connection of the stepped-down voltage output terminals of both step-down circuits makes possible parallel driving of both, selective driving of either or consecutive driving of the two. In the consecutive driving, even if the switched capacitor type step-down circuit is driven after driving the series regulator type step-down circuit first to supply a stepped-down voltage to loads, the switched capacitor type step-down circuit will need only to compensate for a discharge due to the loads, and a peak of a charge current for capacitors can be kept low. When operation of the switched capacitor type step-down circuit is started, no large rush current arises, and occurrence of noise is restrained.

If the semiconductor circuit device is further provided with a starting control circuit which, at the time the external source voltage is applied, first starts a step-down action of the series regulator type step-down circuit and then starts a step-down action of the switched capacitor type step-down circuit, it can be ensured that, when the operation of the switched capacitor type step-down circuit is started, no large rush current arise, and the occurrence of noise be restrained.

The starting control circuit may stop the step-down action of the series regulator type step-down circuit after starting the step-down action of the switched capacitor type step-down circuit. Where the switched capacitor type step-down circuit by itself has a sufficient current supply capacity, this feature can contribute to power saving.

In view of the desirability of not concentrating on a specific frequency in (dispersing) the frequency spectrum of switching noise by changing over the capacitor connection in the switched capacitor type step-down circuit, it is advisable for the switched capacitor type step-down circuit to randomize the timing of changing over the connected state of capacitors in the charge/discharge cycle. For instance, the switched capacitor type step-down circuit may have a random number generating circuit for randomizing the timing of changing over and selecting, by use of the generated random number, the timing of changing over the connected state of capacitors. In short, having the series regulator type step-down circuit take charge of stepping down at the time of applying power supply, the peak current can be lowered and, after the power supply is started, the switched capacitor type step-down circuit will need only to compensate for the discharge due to the loads. As a result, the peak of the current can be kept low. By splitting the switched capacitor type step-down circuit into a plurality of circuits and driving the split circuits with lags in phase, the peak of the power supply current can be further lowered.

The capacitors of the switched capacitor type step-down circuit can be either external capacitors or on-chip capacitors. Each on-chip capacitor can be configured by use of the gate insulating film or an inter-layer insulating film of an MOS transistor as the dielectric.

In a specific mode of implementing the present invention, the semiconductor circuit device may be provided with an external power supply terminal for supplying a stepped-down voltage to outside the semiconductor integrated circuit. This enables the stepped-down voltage to be used as the operating power for another semiconductor circuit device. This also enables the switched capacitor type step-down circuit to subject the stepped-down voltage to variable control for the aging purpose.

[2] A semiconductor circuit device has a step-down unit formed over a semiconductor chip and intended for generating a stepped-down voltage by stepping down an external source voltage, wherein the step-down unit has a switched capacitor type step-down circuit, a switch array constituting the switched capacitor type step-down circuit is split into a plurality of sub-arrays, which are arranged discretely, to each switch sub-array is individually connected a switching capacitance of its own, and a smoothing capacitance is commonly connected to the switch sub-arrays. The common connection of the smoothing capacitance can contribute to restraining an increase in the number of components.

In a specific mode of implementing the present invention, the semiconductor circuit device may have a step-down control circuit for controlling the timing of changing over the connection of a smoothing capacitance and a switching capacitance by the switch array in the charge/discharge cycle, and the step-down control circuit controls the change-over timing of the plurality of switch sub-arrays with lags between them. This contributes to dispersing the spectrum of the high frequency components of noise due to switching for changing over the capacitance connection in the switch array. In short, by splitting the switch array of the switched capacitor type step-down circuit into a plurality of sub-arrays and driving them with lags in phase, the peak of the power supply current can be lowered.

Further, the step-down control circuit generates clock signals lagged in phase from switch array to switch array, and randomizes the connection change-over timing from switch array to switch array on the basis of each of the generated clock signals. Randomization, even if done from switch array to switch array, contributes to dispersing the spectrum of the high frequency noise, and further lowering the peak of the high frequency noise. The step-down control circuit has a random number generating circuit for randomizing the change-over timing, and selects the timing of connection change-over by use of the generated random number.

In a preferable mode of implementing the present invention, the switch arrays are arranged in the vicinity of an externally connected electrode formation area of the semiconductor chip. The distance from external capacitance elements can be thereby shortened, with the result of enabling the influences of wiring resistance and parasitic capacitance to be reduced. The step-down control circuit for controlling switching actions of the plurality of switch arrays is used in common by the plurality of switch arrays, and arranged discretely from the switch arrays. The common use of the step-down control circuit contributes to reducing the size of the step-down unit.

In another preferable mode of implementing the present invention, the semiconductor circuit device further has a series regulator type step-down circuit together with the step-down control circuit, wherein the stepped-down voltage output terminal of the switched capacitor type step-down circuit and that of the series regulator type step-down circuit are connected in common. By driving the switched capacitor type step-down circuit after driving the series regulator type step-down circuit first and supplying the stepped-down voltage to loads, the switched capacitor type step-down circuit has only to compensate for the discharge due to the loads. As a result, the peak of the current for charging the capacitors can be kept low. When the operation of the switched capacitor type step-down circuit is started, no large rush current arises, and the occurrence of noise is restrained.

At the time the external source voltage is applied, the starting control circuit first starts a step-down action of the series regulator type step-down circuit and then starts a step-down action of the switched capacitor type step-down circuit. The presence of this starting control circuit can ensures that, when the operation of the switched capacitor type step-down circuit is started, no large rush current arise, and the occurrence of noise be restrained.

[3] The semiconductor circuit device is used in a battery-powered data processing system. EMI can be reduced, with resultant contributions to the enhancement of the communication performance of mobile communication terminals and portable communication terminals.

Advantages achieved by some of the most typical aspects of the present invention disclosed in the present application will be briefly described below.

It can serve to reduce power consumption accompanying step-down operation.

It can prevent or reduce the occurrence of power supply noise accompanying step-down operation at the time of turning on power supply.

It can contribute to reducing power consumption by battery-powered data processing systems.

DESCRIPTION OF THE PREFERRED
EMBODIMENT OF THE INVENTION

Figure 1:
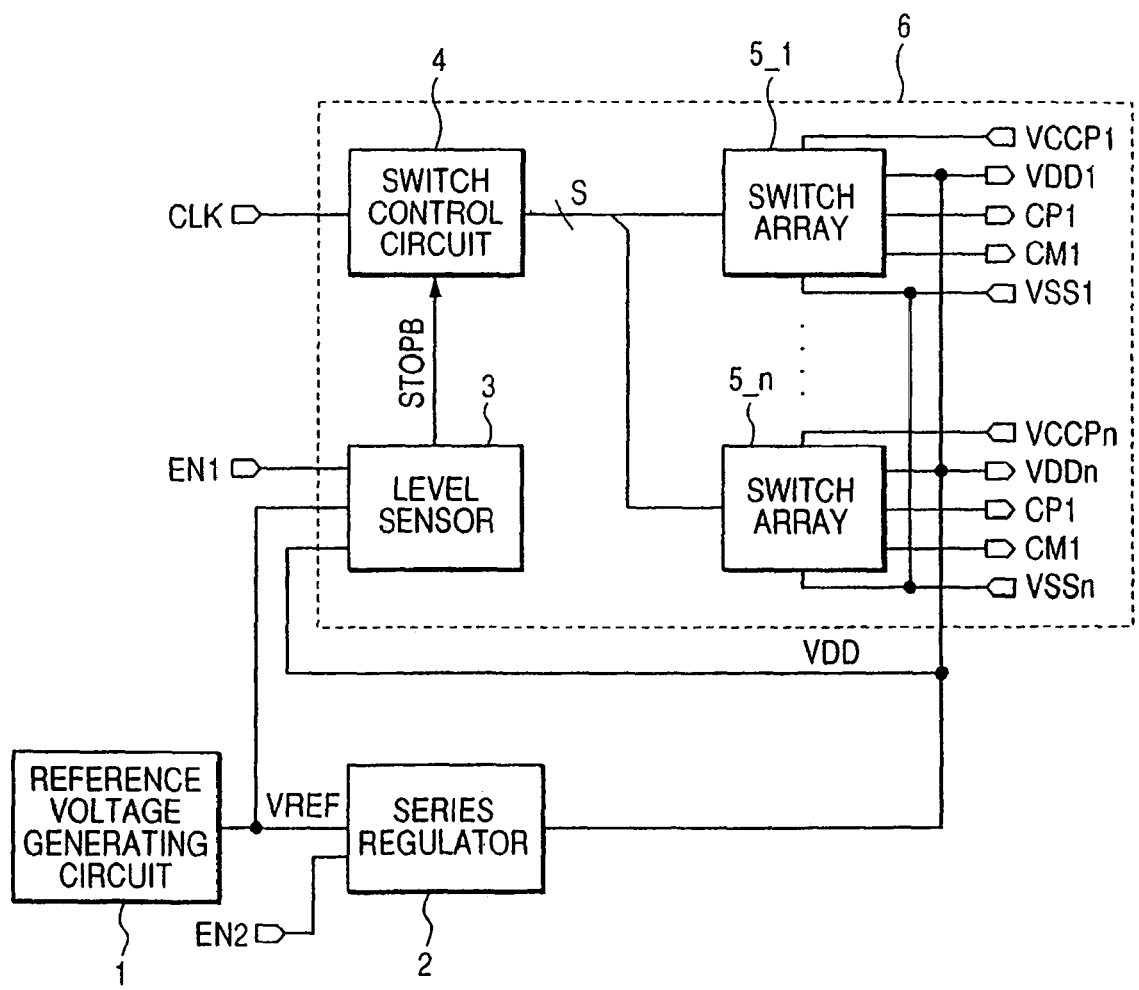
FIG. 1 is a block diagram showing an example of step-down circuit provided in the chip of a semiconductor integrated circuit according to the present invention.

FIG. 1 shows an example of step-down circuit provided in the chip of a semiconductor integrated circuit according to the present invention. The step-down circuit shown therein comprises a reference voltage generating circuit 1, a series regulator type step-down circuit (which may be referred to as simply series regulator) 2, a level sensor 3, a switch control circuit 4 and switch arrays 5_1 through 5_n. The level sensor 3, the switch control circuit 4 and the switch arrays 5_1 through 5_n, together with external capacitors (not shown), constitute a switched capacitor type step-down circuit 6.

The reference voltage generating circuit 1 generates a stable reference voltage VREF, not dependent on temperature or power supply voltage. It may consist of, for instance, a band gap type circuit or a circuit for taking out a threshold voltage difference in an MOS transistor. The series regulator 2 forms a stepped-down voltage VDD by stepping down the voltage with the on-resistance of the transistor. The level of the stepped-down voltage VDD is controlled to be identical with the reference voltage VREF.

The level sensor 3 compares the stepped-down voltage VDD and the reference voltage, and forms a stepped-down action stop signal STOPB for the switched capacitor type step-down circuit. The switch control circuit 4 generates a plurality of switch control signals S for controlling the switch arrays 5_1 through 5_n on the basis of a clock signal CLK. The switch arrays 5_1 through 5_n are switch circuits for constituting switched capacitors which divide capacitances while consecutively altering the connection state of capacitors which receive input voltages. Reference sign VDDCPi denotes an input voltage terminal, VDDi, an output voltage terminal, VSSi, the grounding terminal of the circuit, and CPi and CMi, terminals for externally connecting the capacitors (i=1 to n). Output terminals VDD1 through VDDn are connected within the chip. So are grounding terminals VSS1 through VSSn.

The output of the switched capacitor type step-down circuit 6 and that of the series regulator 2 are commonly connected. Thus, the output terminals VDD1 through VDDn of the switched capacitor type step-down circuit 6 are commonly connected to the output terminal of the series regulator 2.

Figure 2A:
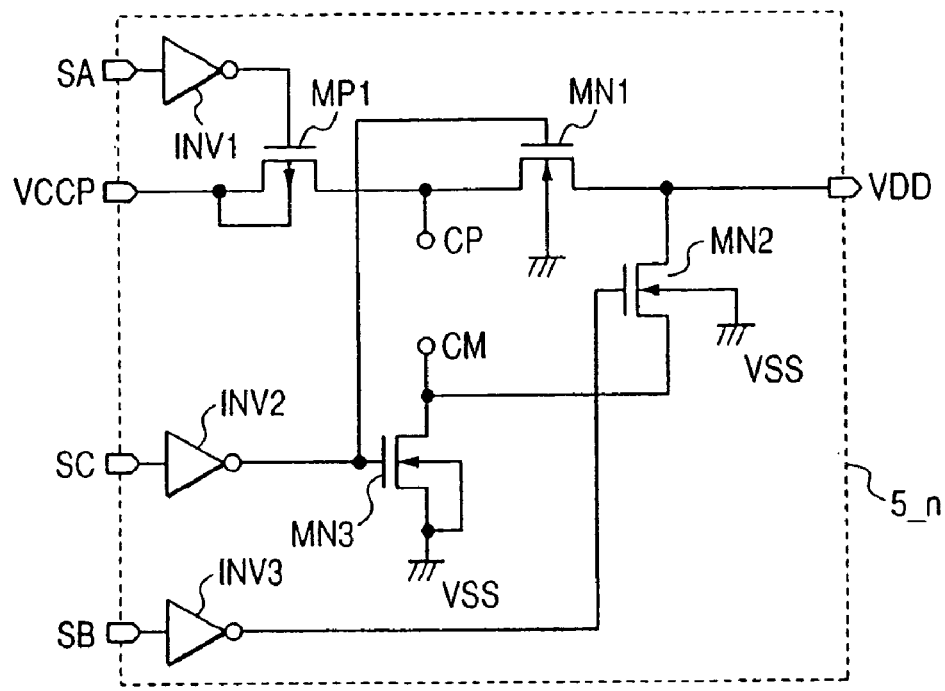
FIG. 2A is a circuit diagram of a switch array contained in the step-down circuit.
Figure 2B:
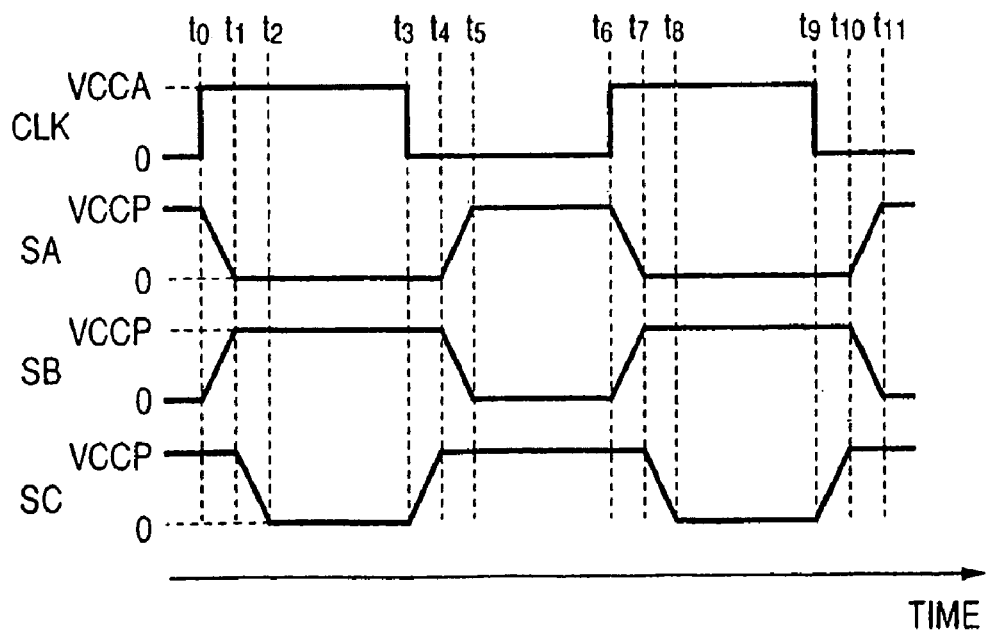
FIG. 2B is a timing chart showing the timing of switch control over the switch array of FIG. 2A.

FIG. 2A shows one of the switch arrays 5_1 through 5_n as an example. The switch arrays 5_1 through 5_n have the same configuration, and will be hereinafter represented by the switch array 5_n. The switch control signals S of FIG. 1 are supposed here to be three switch control signals SA, SB and SC. The switch circuit of FIG. 2A enables the switched capacitor circuit of FIG. 28 to be equivalently configured. A P-channel MOS transistor MP1 corresponds to a switch SW1 of FIG. 28, an N-channel MOS transistor MN1 corresponds to a switch SW2 of FIG. 28, an N-channel MOS transistor MN2 corresponds to a switch SW3 of FIG. 28; and an N-channel MOS transistor MN3 corresponds to a switch SW4 of FIG. 28. As shown in FIG. 2B by way of example, the switch control signals SB and SC are not set to a low level at the same time, and the switch control signal SA is made an inverted signal of the switch control signal SB.

Figure 28:
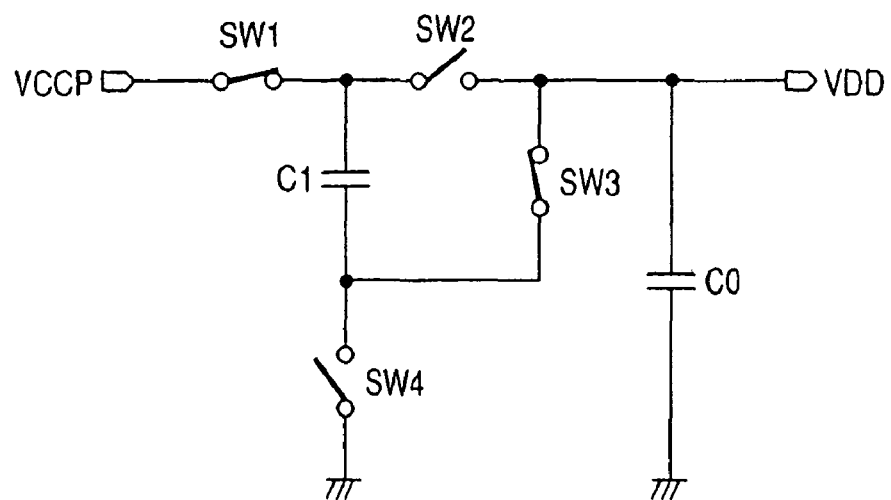
FIG. 28 equivalently illustrates the switch circuit of FIG. 2A.

In the circuit of FIG. 2A, a capacitor C1 (switching capacitance) of FIG. 28 is connected to terminals CM and CP, and a capacitor C0 (smoothing capacitance) is externally connected between the grounding terminal and the output terminal VDD of the circuit. According to the switch control timing of FIG. 2B, the switches SW1 and SW3 are turned on, the switches SW2 and SW4 are turned off, and the capacitors C0 and C1 are connected in series and charged with VCCP. Next, the switches SW1 and SW3 are turned off, the switches SW2 and SW4 are turned on, and the capacitors C0 and C1 are connected in parallel. The output voltage VDD will be roughly VCCP/2 if the on-resistance of the switches is ignored. By changing over the connection of the two capacitors C0 and C1 in this way, the input voltage VCCP is stepped down to generate the output voltage VDD. If, for instance, 2.8 V is applied to the input voltage terminal VCCP, 1.4 V will be supplied from the output voltage terminal VDD.

Referring to FIG. 2A, the channel widths/channel lengths of the MOS transistor are, for example, MP1=3200/0.4, MN1=2800/0.4, MN2=2800/0.4 and MN3=1200/0.4 (in μm). MN1 and MN2 are larger in size than MN3. This is because the channel width is expanded to reduce the on-resistance as the gate-source voltage is small, VCCP−VDD, and a substrate bias (−VDD) works.

The MOS transistors MP1, MN1 and MN2 have low threshold voltages and the MOS transistor MN3 have a high threshold voltage. The reason for the low threshold voltages of the MOS transistors MP1, MN1 and MN2 is that they are to reduce the on-resistance. The reason for the high threshold voltage of the MOS transistor MN3 is that it is to reduce the leak current when the operation is stopped. When the operation is stopped, SA is at a high level, SB is at a low level, and SC is at a high level. Thus, the MOS transistors MP1 and MN2 are on, and the MOS transistors MN1 and MN3 are off. If the threshold voltage of the MOS transistor MN3 is low, a sub-threshold leak current may flow because VDD is applied between the drain and the source. Although the drain-source voltage of the MOS transistor MN1 is VCCP−VDD, the effective threshold voltage is high and the leak current is little, because a substrate bias is applied.

The reason why not only the MOS transistors MP1, MN1 through MN3 for switching but also inverters INV1 through INV3 for driving their gates are contained in the switch array 5_n is to reduce the influence of wiring resistance in view of the arrangement of the switch control circuit 4 away from the switch arrays 5_1 through 5_n.

Figure 3:
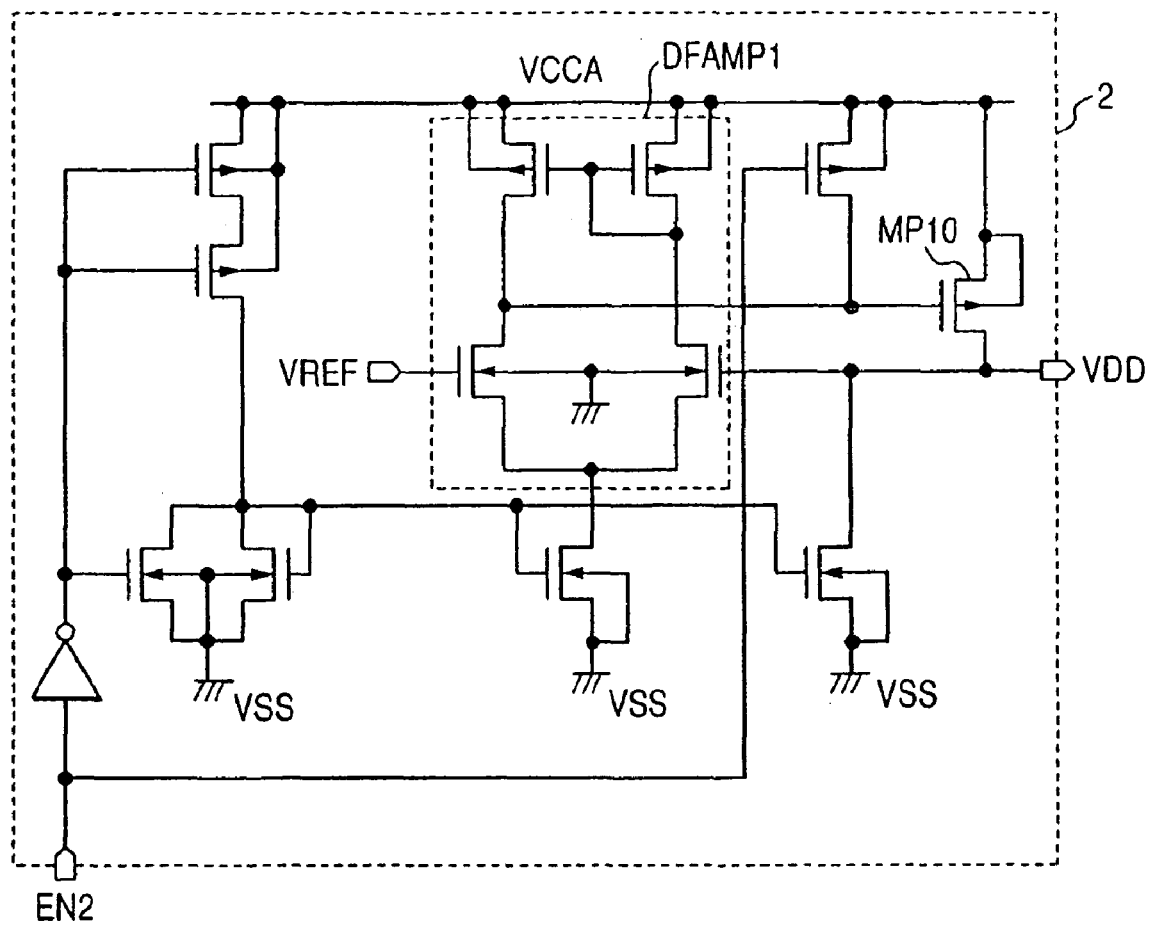
FIG. 3 is a circuit diagram showing an example of details of a series type step-down circuit.

FIG. 3 shows an example of detailed circuitry of the series type step-down circuit 2. This step-down circuit 2 compares the reference voltage VREF and the voltage VDD with a differential amplifier DFAMP1, and controls an output MOS transistor MP10. The output MOS transistor MP10 is of a P-channel type, and its channel width/channel length is, for instance, 500/0.4 (in μm). It is smaller in size than the MOS transistor MP1 of the switch array. The purpose is to lower the power supply current peak at the time of turning on the power supply. Reference sign VCCA denotes an input voltage terminal, whose voltage level is the same as VCCP. Reference sign EN2 denotes an enable signal for the series type step-down circuit 2, which is enabled when EN2 is at a high level and disabled when it is at a low level.

Figure 4:
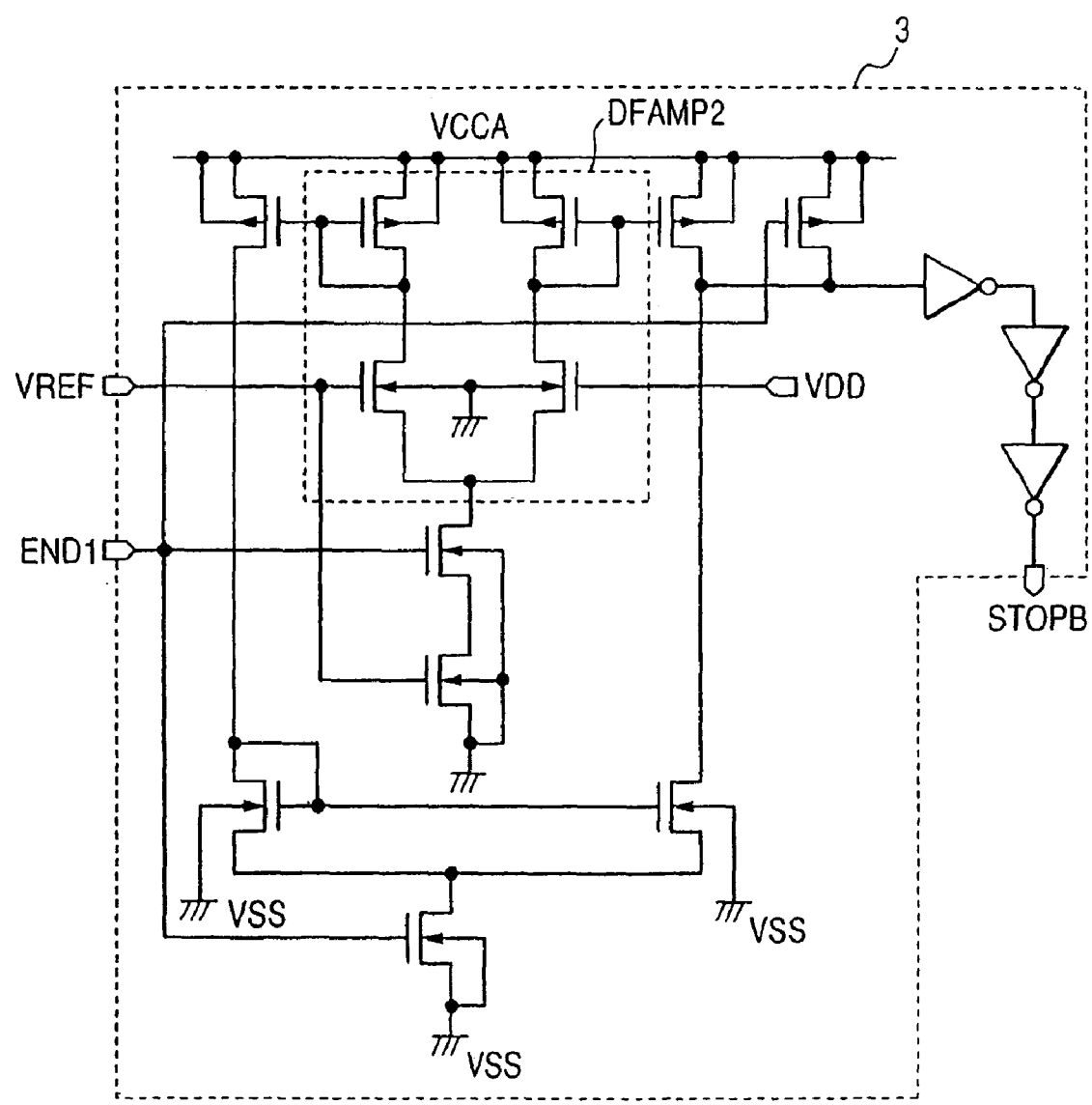
FIG. 4 is a circuit diagram showing an example of details of a level sensor.

FIG. 4 shows an example of detailed circuitry of the level sensor 3. A differential amplifier DFAMP2 compares the voltage VDD and the reference voltage VREF, and generates a stop signal STOPB. When the voltage VDD is lower than the reference voltage VREF, STOPB is at a high level, and when the voltage VDD is higher than the reference voltage VREF, STOPB is at a low level. Reference sign EN1 denotes an enable signal for the switched capacitor type step-down circuit, which is enabled when EN1 is at a high level and disabled when it is at a low level. When EN1 is at a low level, STOPB is at a low level irrespective of the voltage VDD.

Figure 5:
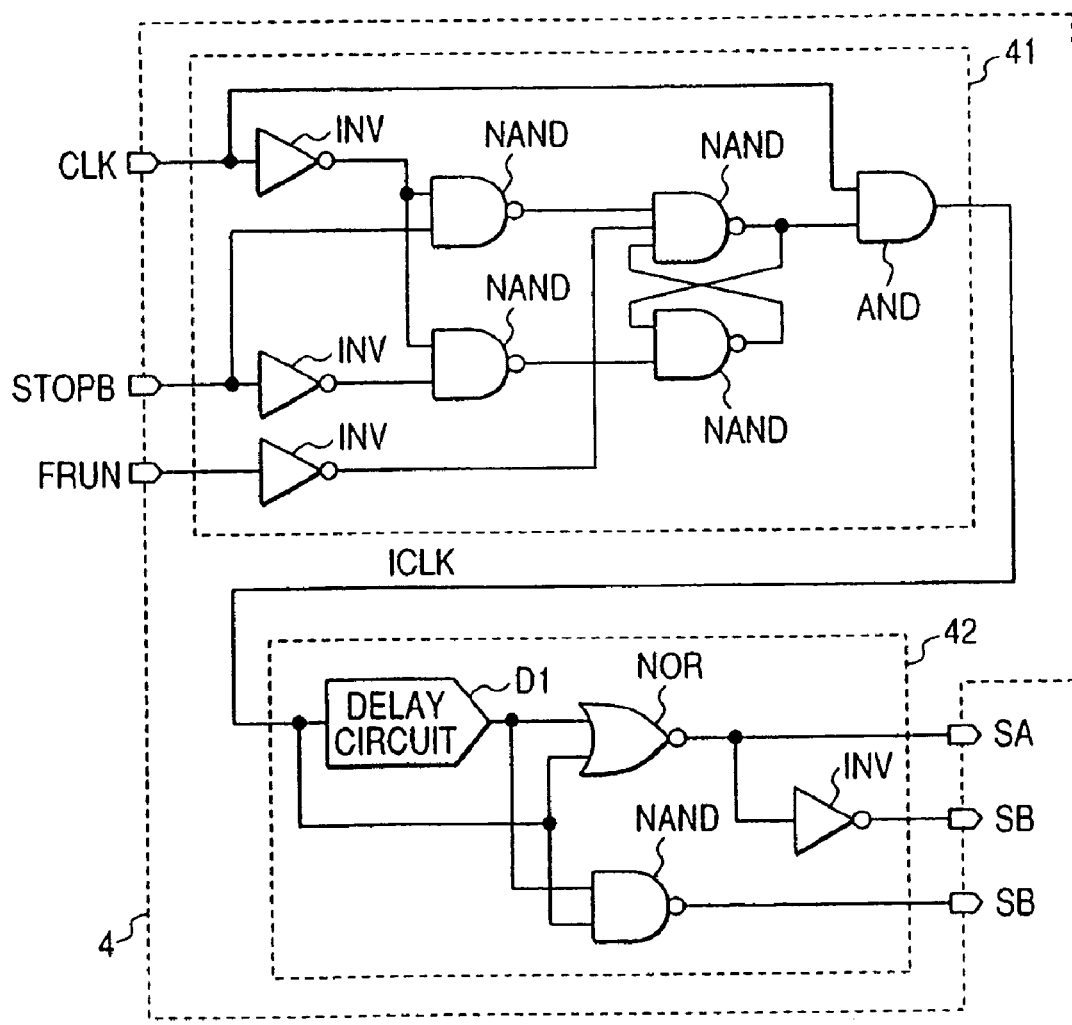
FIG. 5 is a logical circuit diagram showing an example of details of a switch control circuit.

FIG. 5 shows an example of detailed logical circuitry of the switch control circuit 4 of FIG. 1. It has a circuit 41 for generating an internal clock ICLK from a clock CLK and a circuit 42 for generating the switch control signals SA, SB and SC from the internal clock ICLK. Reference sign INV denotes an inverter, NAND, a NAND gate, AND, an AND gate, NOR, a NOR gate, and D1, a delay circuit. Sign CLK denotes a clock input terminal, STOPB, a stop signal, and FRUN, a free-run signal for testing use.

During normal operation, FRUN is at a low level. If then STOPB is at a high level, the internal clock ICLK will follow the clock CLK. If STOPB is at a low level, the internal clock ICLK will be set to a low level. Even if the stop signal STOPB shifts from a high level to a low level while the internal clock ICLK is at a high level, the internal clock ICLK will not immediately fall to a low level, but will do so when the clock CLK falls to a low level next time.

If FRUN is at a high level, the internal clock ICLK will follow the clock CLK irrespective of the stop signal STOPB. The delay circuit D1 is provided to prevent a through-current from being allowed to flow by the simultaneous fall of signals SB and SC in FIG. 2 to a low level.

Figure 6:
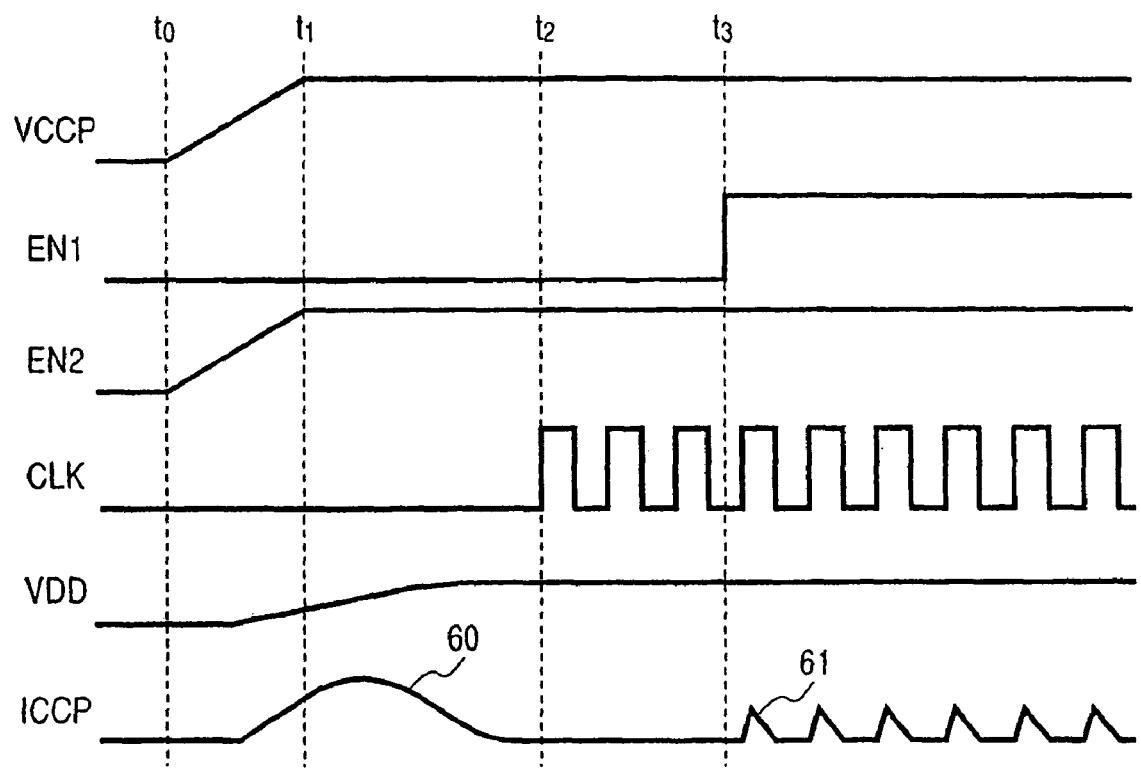
FIG. 6 is a timing chart showing an example of operational waveform at the time of turning on power supply to a step-down circuit.

FIG. 6 shows an example of operational waveform at the time of turning on power supply to the step-down circuit of FIG. 1. From time t0 to t1, the power supply VCCP is actuated. Since the enable signal EN2 for the series type step-down circuit is equal to VCCP, the series type step-down circuit 2 is operated. This actuates VDD. As EN1 is at a low level then, the switched capacitor type step-down circuit 6 does not yet operate. The clock is entered from time t2 onward and when EN1 rises to a high level at time t3, the switched capacitor type step-down circuit 6 begins to operate. Incidentally, the sequence between the clock input and EN1 may as well be reverse.

Reference sign ICCP denotes a current flowing to the power source VCCP. Although a large current flows from t0 till t3 to actuate VDD, the current waveform is not steep as indicated by waveform 60 because the only operating element is the series type step-down circuit 2. This is because the current flows through an MOS transistor having a high on-resistance (MP10 in FIG. 3). As a switch MOS transistor whose on-resistance is low is turned on when the switched capacitor type step-down circuit 6 begins operation, the current waveform becomes sharp as indicated by waveform 61. As VDD is already actuated by this time, only a sufficient current to make up for the discharge due to the load needs to be supplied, and its peak is low. In short, even though the switched capacitor type step-down circuit 6 is driven after a stepped-down voltage is supplied to the load by driving the series regulator 2 earlier, the switched capacitor type step-down circuit 6 will need to be compensated only for the discharge due to the load, the current to charge the capacitors will have only low peaks. No large rush current occurs when the switched capacitor type step-down circuit 6 starts operation, and the occurrence of noise can be prevented or reduced.

Instead, after the power supply is actuated, the operation of the series type step-down circuit 2 may be stopped by setting EN2 to a low level. Or the operation of the series type step-down circuit 2 may be actuated or stopped according to the operating mode. For instance, in an operating mode entailing relatively high current consumption, both the series type step-down circuit 2 and the switched capacitor type step-down circuit 6 can be operated to increase the current supply capacity, and in an operating mode entailing relatively low current consumption, only the switched capacitor type step-down circuit 6 can be operated to enhance the efficiency of power conversion.

Figure 7:
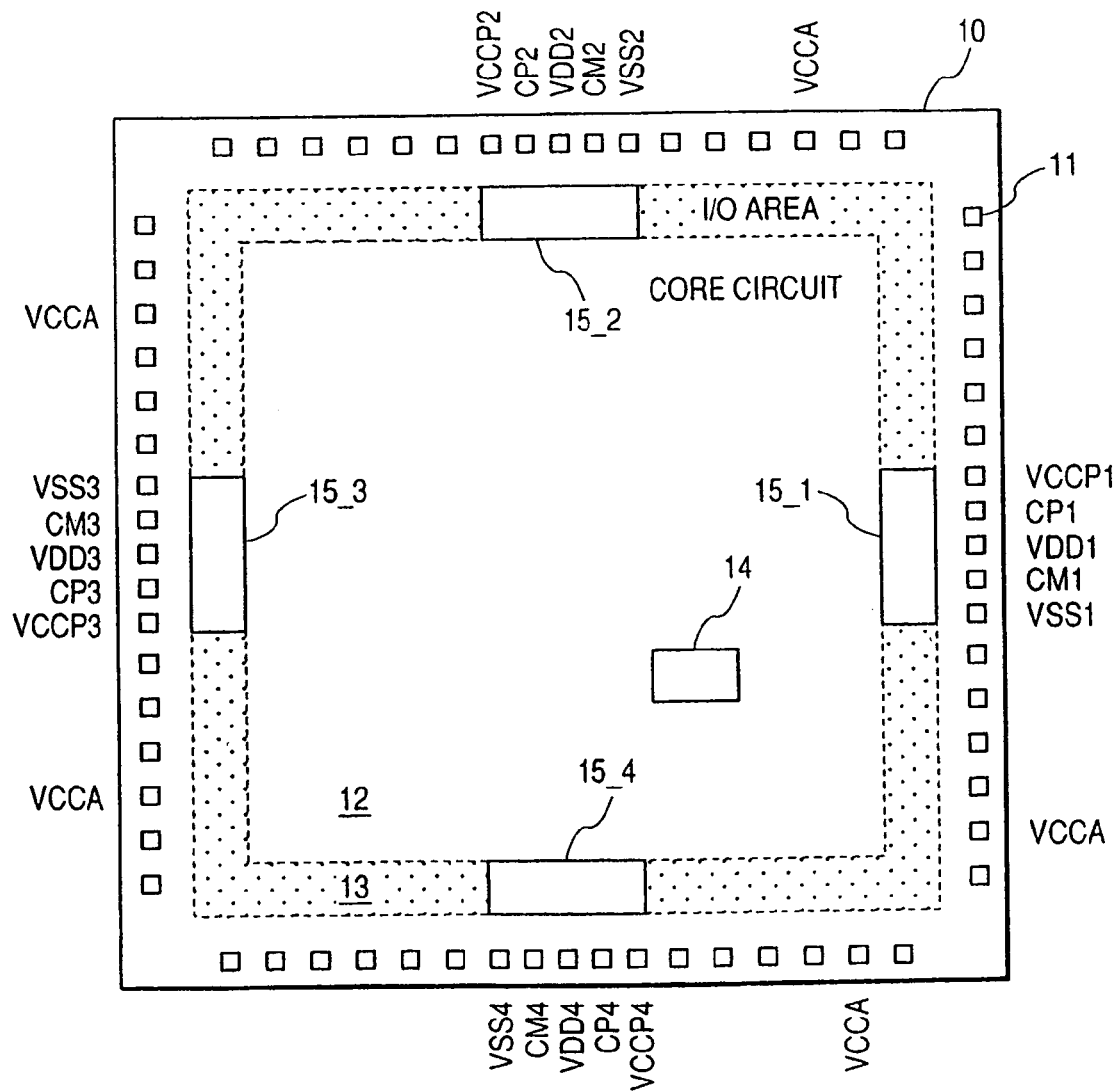
FIG. 7 is a layout diagram showing an example of arrangement in the LSI chip of the step-down circuit.

FIG. 7 shows an example of arrangement in the LSI chip of the step-down circuit of FIG. 1. Reference numeral 10 denotes the chip of the semiconductor integrated circuit (LSI chip), and 11, bonding pads. In particular, reference signs VCCP1 through VCCP4 denote bonding pads for the input voltage VCCP, VDD1 through VDD4, bonding pads for the output voltage VDD, and VSS1 through VSS4, bonding pads for grounding use. Signs CP1 through CP4 and CM1 through CM4 denote bonding pads for external connection of capacitors. The area denoted by 12 in the LSI chip 10 is the core circuit section, where the principal parts of the semiconductor integrated circuit are arranged. The area denoted by 13 is the I/O area, where input/output circuits are mainly disposed.

A circuit area 14 arranged in the core circuit section 12 accommodates the reference voltage generating circuit 1, the series type step-down circuit 2, the level sensor 3 and the switch control circuit 4. This circuit area 14 is supplied with power supply VCCA as the operating power. The power supply pad for feeding the operating power VCCA to the circuit area 14 should preferably be separated from the power supply pad VCCP1 through VCCP4 for the switch array to prevent power supply noise even if the voltage level is the same. It is also preferable to separate ground voltage wiring from digital circuits in the core circuit section 12.

Reference numerals 15_1, 15_2, 15_3 and 15_4 denote areas in which switch arrays and protective elements for the prevention of electrostatic destruction are arranged in the I/O area 13.

Though not shown, wiring for switch control signals SA, SB and SC is arranged from the circuit area 14 to circuit areas 15_1, 15_2, 15_3 and 15_4. For the power supply voltage VDD as operating power for the core circuit section 12, meshed wiring is arranged within the LSI chip 10.

Since the areas 15_1 through 15_4 in which the switch arrays are arranged are disposed in the I/O area which is near bonding pads 11, the parasitic capacitance and parasitic resistance due to wiring can be minimized. Also, as the power source VCCA for the reference voltage generating circuit 1 and the level sensor 3 and the power source VCCP for the switch arrays are separated from each other, power supply noise due to switch operation can be prevented from adversely affecting the reference voltage generating circuit 1 and the level sensor 3.

Figure 8:
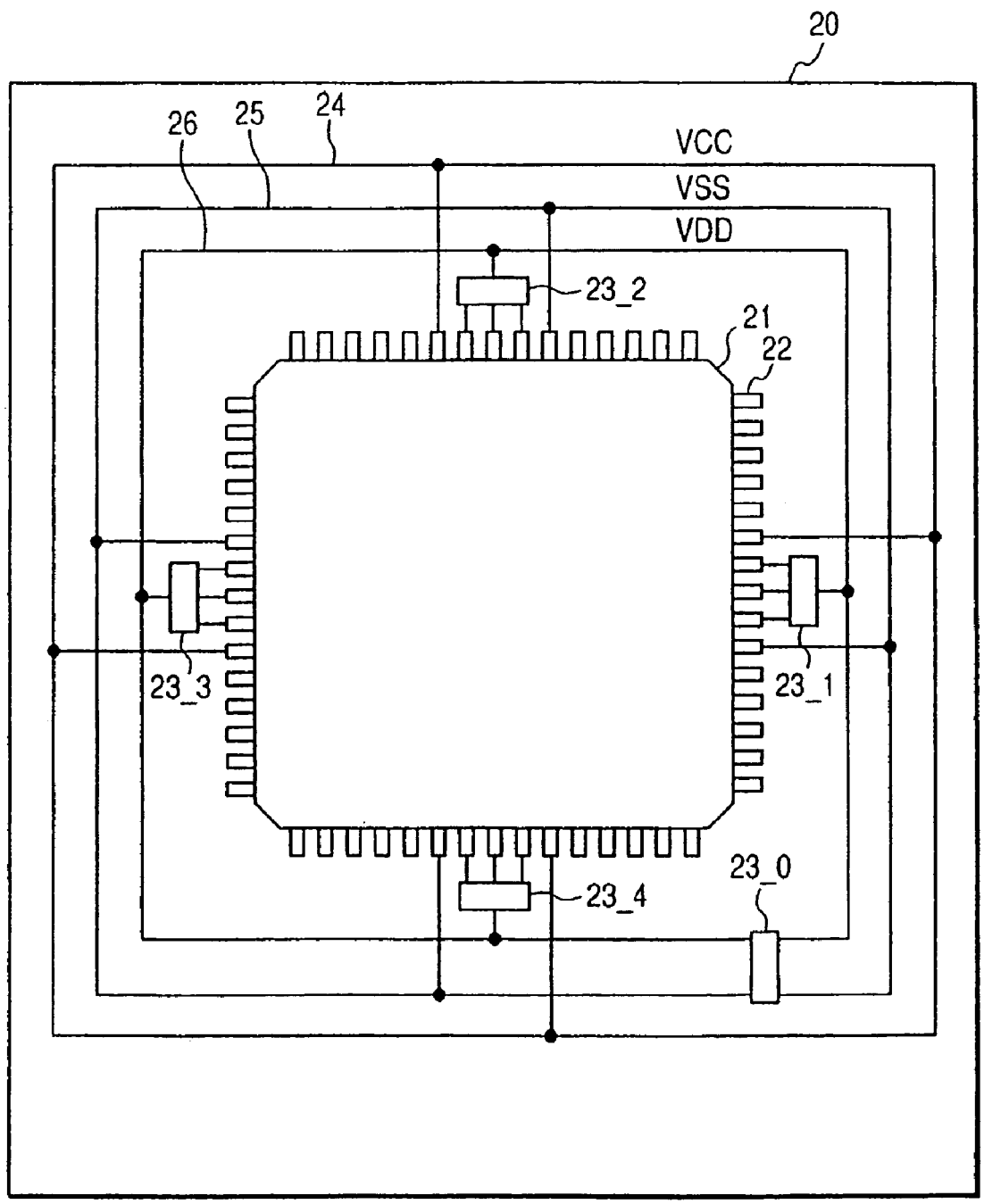
FIG. 8 is a plan showing an example of state in which a step-down circuit-mounted semiconductor integrated circuit is mounted on a wiring board.

FIG. 8 shows an example of state in which a semiconductor integrated circuit mounted with the step-down circuit of FIG. 1 is mounted on a wiring board. Reference numeral 20 denotes a wiring board (board), and 21 denotes a package of the semiconductor integrated circuit (LSI package), in which the LSI chip of FIG. 7 is sealed. Numeral 22 denotes external terminals of the semiconductor integrated circuit, and 23_0 denotes a capacitor such as a chip capacitor, whose electrostatic capacity is supposed to be 1 µF for instance, matching the capacitance C0 of FIG. 28. Numerals 23_1 through 23_4 denote capacitors such as chip capacitors, whose electrostatic capacity is supposed to be 0.1 µF for instance, corresponding to the capacitance C1 of FIG. 28. Numeral 24 denotes on-board wiring for power supply VCC, 25, on-board wiring for grounding potential VSS, and 26 denotes on-board wiring for the stepped-down voltage VDD.

The switched capacitor type step-down circuit 6 is provided with four sets of the circuit configuration of FIG. 1 on an LSI chip, and four capacitors 23_1 through 23_4 are mounted to match them. Only one smoothing capacitor 23_0 is mounted for common use by the four sets of circuits. This arrangement for common use contributes to reducing the cost and the mounting area. It is preferable for the capacitors 23_1 through 23_4 to be mounted as close as practicable to the terminals in order to reduce parasitic capacitance and parasitic resistance.

Figure 9:
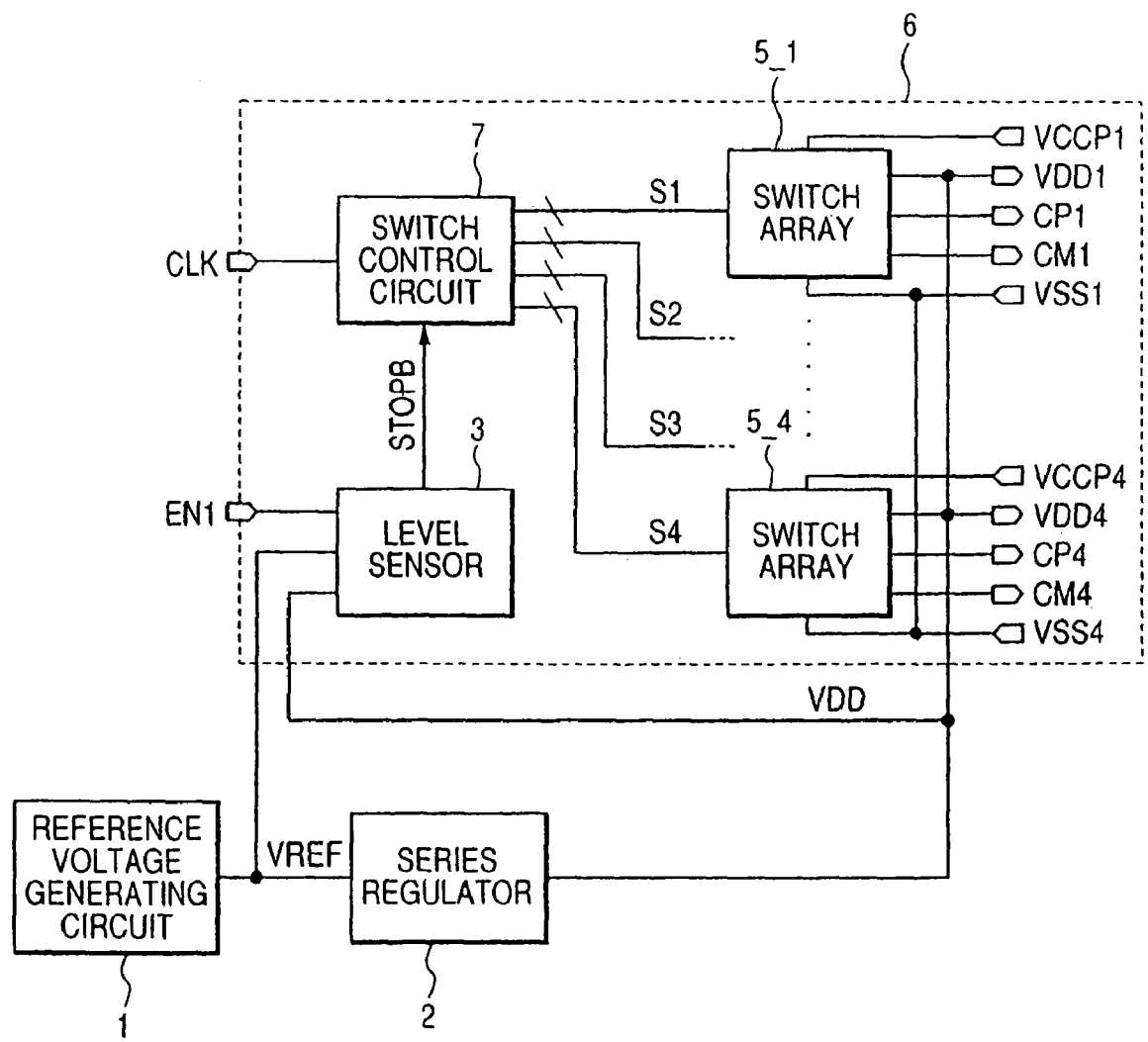
FIG. 9 is a block diagram showing a second example of step-down circuit provided in the chip of a semiconductor integrated circuit pertaining to the present invention.
Figure 10:
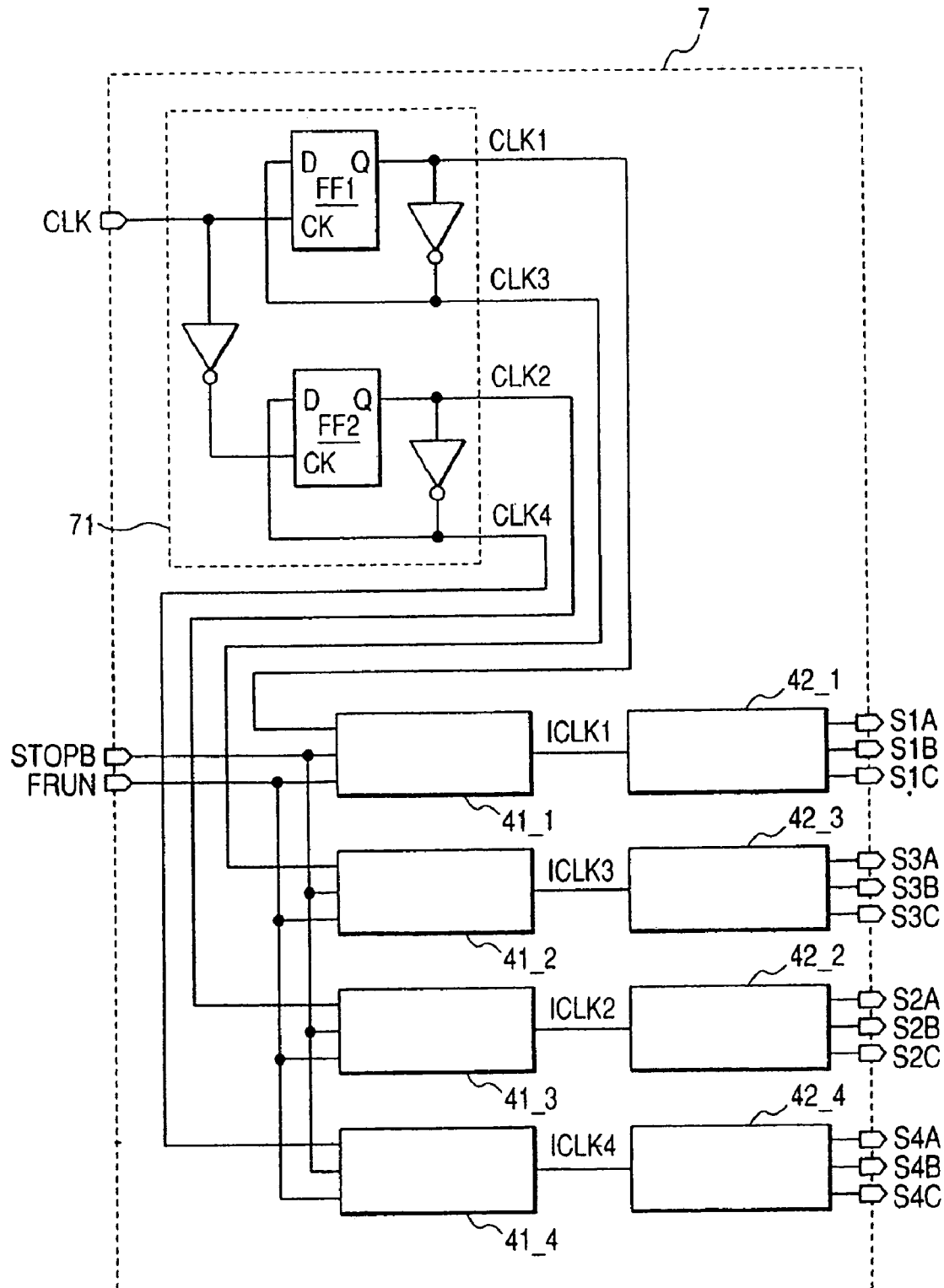
FIG. 10 is a logical circuit diagram showing an example of details of the switch control circuit of FIG. 9.

FIG. 9 shows a second example of step-down circuit provided in the chip of the semiconductor integrated circuit pertaining to the present invention. The step-down circuit shown therein differs in its switch control circuit 7 from the circuit of FIG. 1. Thus the difference from FIG. 1 is that a plurality of (four in this case) switch arrays 5_1 through 5_4 are driven with control signals S1 through S4 differing in phase from one another. The control signal S1 actually consists of three signals S1A, S1B and S1C as shown in FIG. 10. This is also true of the signals S2 through S4. This enables the peak of the power supply current to be lowered. As the plurality of switch arrays 5_1 through 5_4 are controlled with lags in the timing of changing over in this way, reduction of high frequency noise due to switching for changing over the capacitance connection in the switch arrays 5_1 through 5_4 is facilitated. In other words, splitting the switch array of the switched capacitor type step-down circuit into a plurality of sub-arrays and driving the split sub-arrays with phase lags serves to lower the peak of the power supply current.

FIG. 10 shows an example of detailed circuitry of the switch control circuit 7 of FIG. 9. Circuits 41_1 through 41_4 are the same as the circuit 41 in FIG. 5, and generate internal clocks ICLKi (i=1 to 4) from the respectively matching clocks CLKi. Circuits 42_1 through 42_4 are the same as the circuit 42 in FIG. 5, and generate switch control signals SiA, SiB and SiC (i=1 to 4) from the respectively matching internal clocks ICLKi. The circuit denoted by 71 is a frequency dividing circuit, which divides the frequency of the clock CLK to generate the clocks CLK 1 through CLK4. Reference signs FF1 and FF2 denote D flip-flops operating at the leading edge of the clock input (CK). Signs CLK1, CLK2, CLK3 and CLK4 denote clocks whose period is twice as long as that of the clock CLK and lagging in phase by 90 degrees from one to next. Examples of waveforms of the clocks CLK 1 through CLK4 thereby formed are shown in FIG. 30.

Figure 30:
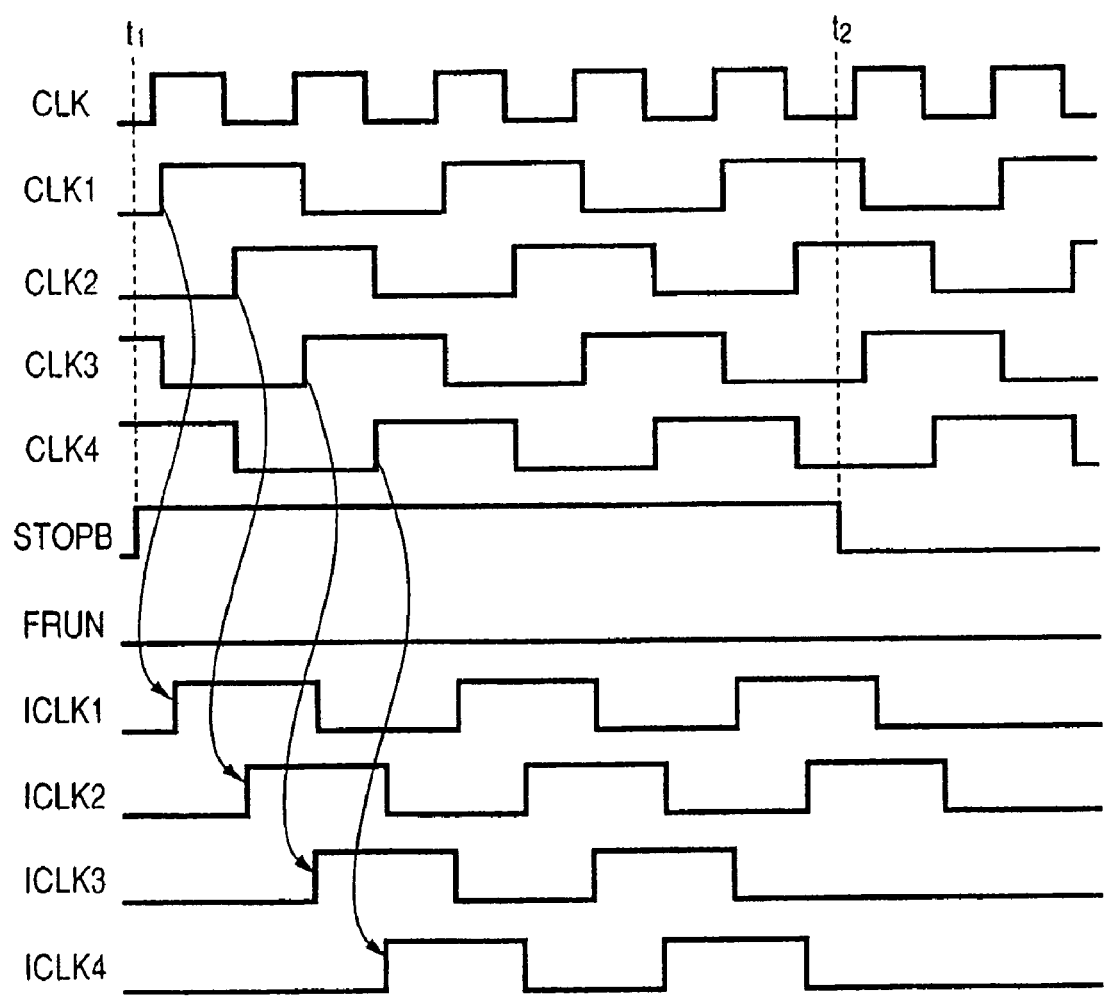
FIG. 30 is a timing chart showing the operational waveform of the switch control circuit of FIG. 10.

Referring to FIG. 30, CLK1 varies at the leading edge of CLK. CLK2 varies at the trailing edge of CLK. CLK3 is supposed to be the inverted signal of CLK1. CLK4 is supposed to be the inverted signal of CLK2. In the initial state, the signal STOPB is at a low level, and ICLK1 through ICLK4 are all set to a low level. When the signal STOPB rises to a high level at time t1, the clock ICLK1 is generated from the clock CLK 1, the clock ICLK2 from the clock CLK 2, the clock ICLK3 from the clock CLK3, and the clock ICLK4 from the clock CLK 4. Even if the signal STOPB falls to a low level at time t2, the clock ICLK1 which is already at a high level then does not immediately fall to a low level, but falls to a low level only when the clock CLK 1 falls to a low level next time. The same is true of the clock ICLK2. The clock ICLK3 and the clock ICLK4, as they are at a low level at time t2, remain at the low level as they are.

Figure 11:
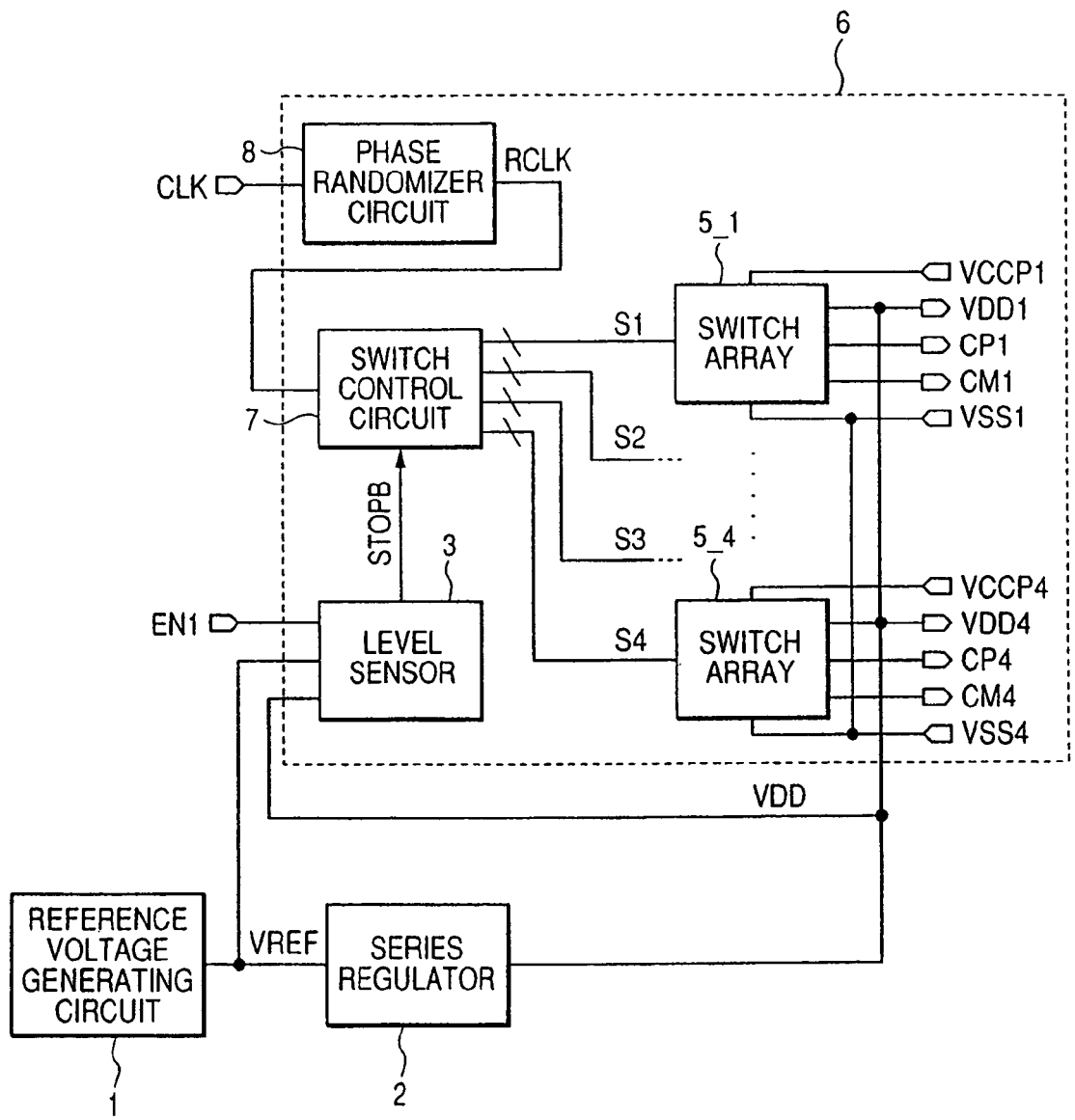
FIG. 11 is a block diagram showing a third example of step-down circuit provided in the chip of a semiconductor integrated circuit pertaining to the present invention.

FIG. 11 shows a third example of step-down circuit provided in the chip of the semiconductor integrated circuit pertaining to the present invention. The difference from the circuit shown in FIG. 9 consists in the addition of a phase randomizer circuit 8. The phase randomizer circuit 8 generates a clock RCLK by shifting at random the rise and fall timings of the clock CLK, and makes it an input to the switch control circuit 7. This provides an advantage of making it possible to disperse the spectrum of the high frequency components of noise. It can be applied with particular effectiveness to portable wireless devices, such as cellular phones, because it serves to disperse the spectrum of jamming waves.

Figure 12:
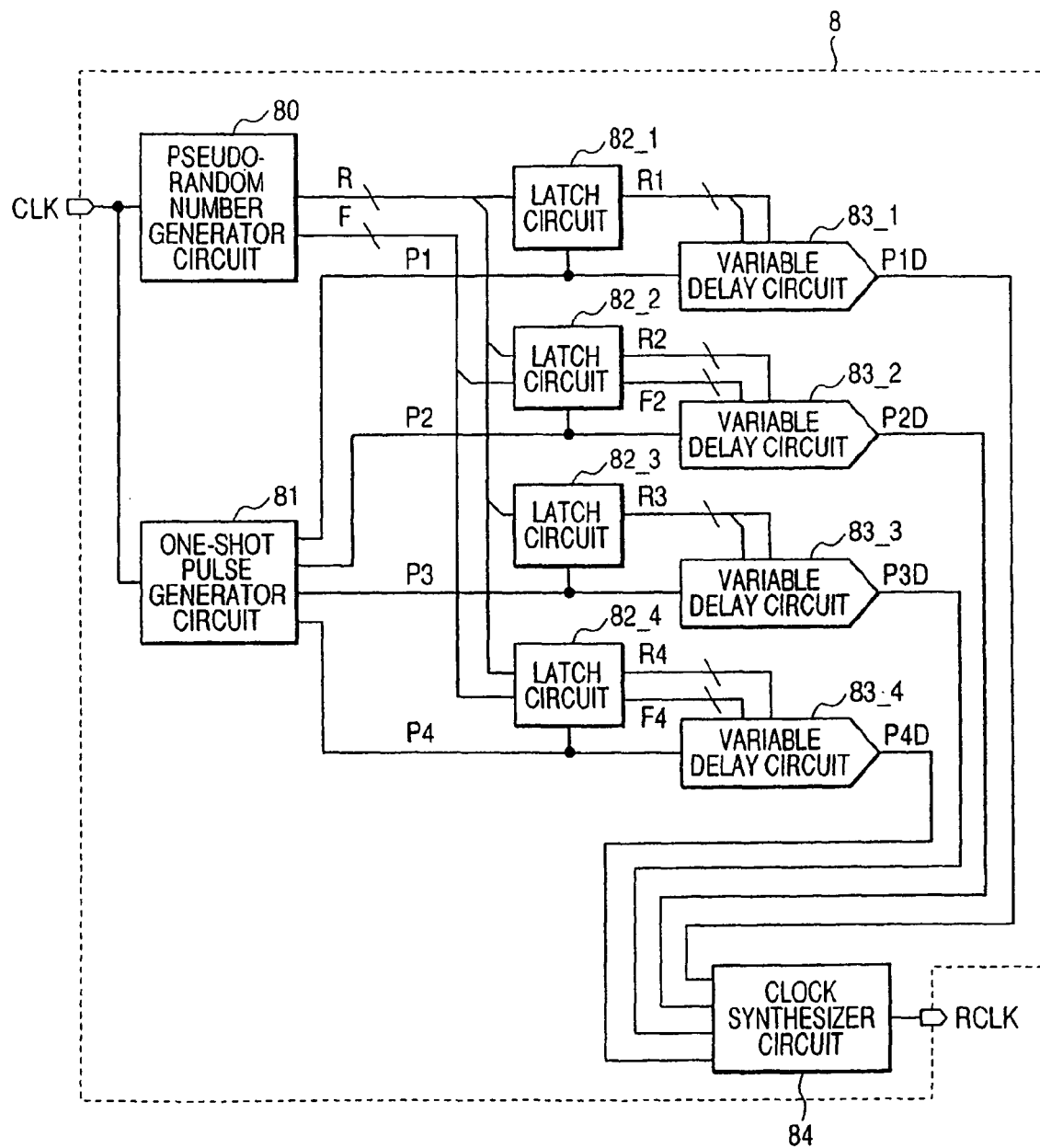
FIG. 12 is a logical circuit diagram showing an example of logical configuration of a phase randomizer circuit.

FIG. 12 shows an example of logical configuration of the phase randomizer circuit 8. Reference numeral 80 denotes a pseudo-random number generator circuit, 81 denotes a one-shot pulse generator circuit, and 82_1 through 82_4 denotes latch circuits. Since signals R and F to be latched have a plurality of bits each, actually each of the latch circuits 82_1 through 82_4 consists of a plurality of latches. Numerals 83_1 through 83_4 denote variable delay circuits. The delay time is determined by control signals R1, R2, F2, R3, R4 and F4. Numeral 84 denotes a clock synthesizer circuit.

R and F are pseudo-random numbers. Actually each consists of a plurality of bits (e.g. five bits). F is supposed to be a signal a half cycle earlier than R.

Reference sign P1 denotes a one-shot pulse which rises to a high level at the leading edge of each odd-number cycle of the clock CLK and stays there for a prescribed length of time. Sign P2 denotes a one-shot pulse which rises to a high level at the trailing edge of each odd-number cycle of the clock CLK and stays there for a prescribed length of time. Sign P3 denotes a one-shot pulse which rises to a high level at the leading edge of each even-number cycle of the clock CLK and stays there for a prescribed length of time. Sign P4 which rises to a high level at the trailing edge of each even-number cycle of the clock CLK and stays there for a prescribed length of time. Signs P1D, P2D, P3D and P4D respectively denote signals resulting from the delaying of P1, P2, P3 and P4 by variable delay circuits.

The phase randomizer circuit 8 having the configuration of FIG. 12 can control the delay quantities of the leading/trailing edges of each cycle of the clock CLK by taking out the leading/trailing edges with a one-shot pulse generator circuit 81 and letting each edge pass variable delay circuits 83_1 through 83_4. In short, P1 and P3 are subjected to pulse variation in synchronism with the leading edge of the clock CLK; P2 and P4 are subjected to pulse variation in synchronism with the trailing edge of the clock CLK; latches 82_1 through 82_4 latch random numbers R and F in response to pulse variations of the signals matching P1 through P4; the variable delay circuit 83_1 through 83_4 delay the pulse variations of the signals matching P1 through P4 according to the random numbers R and F and supply the delayed pulses as PD1 through PD4; and the clock synthesizer circuit 84 varies the clock RCLK to a high level in synchronism with the pulse variations of PD1 and PD3 and the clock RCLK to a low level in synchronism with the pulse variations of PD2 and PD4. This results in randomization of the clock RCLK relative to the clock CLK.

Figure 13:
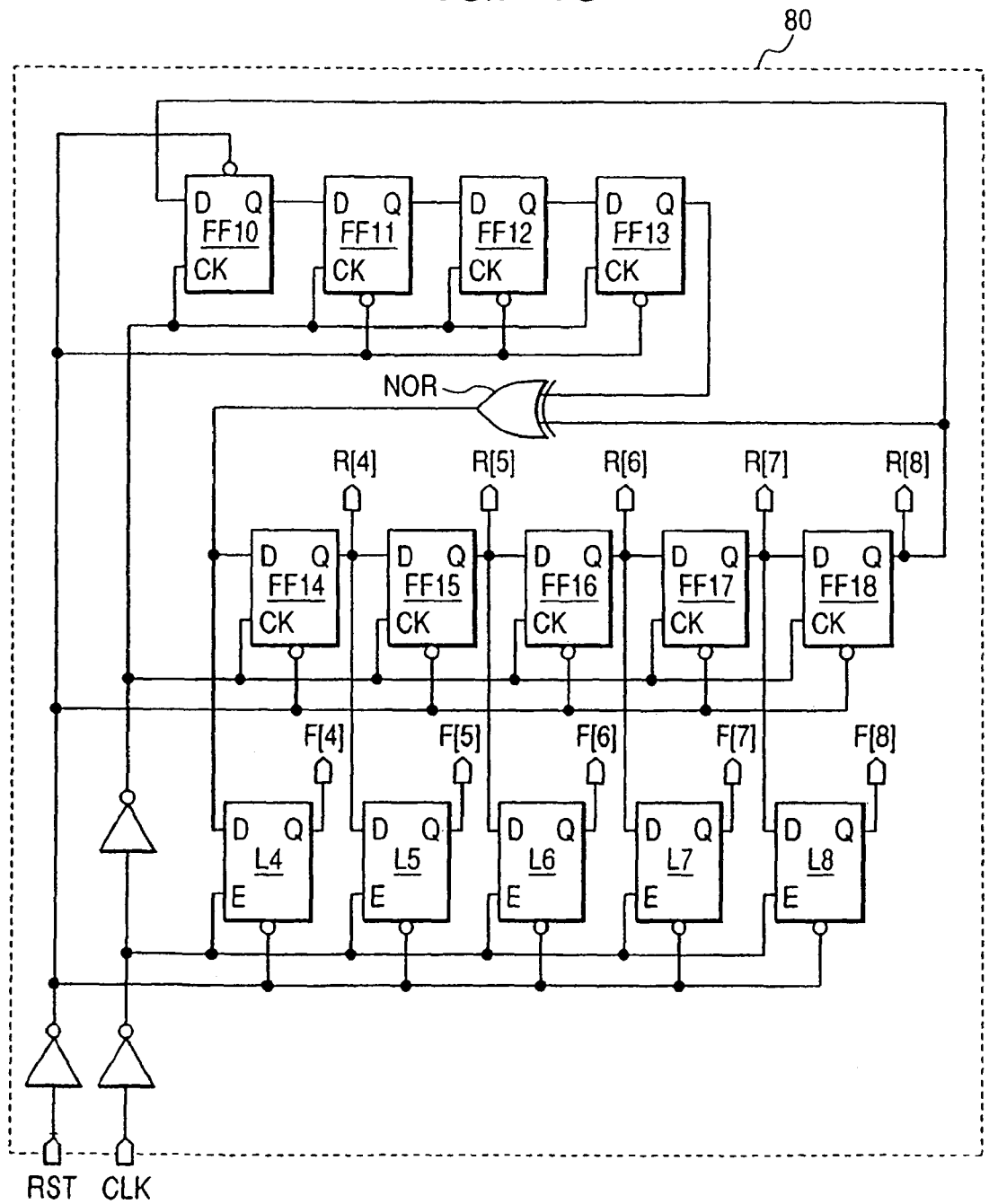
FIG. 13 is a logical circuit diagram showing an example of logical configuration of the pseudo-random number generator circuit of FIG. 12.

FIG. 13 shows an example of logical configuration of the pseudo-random number generator circuit 80 of FIG. 12. Reference signs FF10 through FF18 denote D flip-flops operating at the leading edge of the clock input (CK). Signs L4 through L8 denote latches, which let through when the enable input (E) is at a high level and perform latching when it is at a low level. Reference sign EOR denotes an exclusive OR gate, and RST, a reset signal. By raising the reset signal RST to a high level, the output of the D flip-flop FF10 is set to a high level, the outputs of the D flip-flops FF11 through FF18 to a low level, and those of latches L4 through L8 to a low level. The logical configuration comprising D flip-flops FF11 through FF18 and EOR is a common configuration for a pseudo-random number generator circuit. The latches L4 through L8 latch earlier by a half cycle of the clock CLK than the same inputs as those for the D flip-flops FF14 through FF18.

R[4] through R[8] are pseudo-random number outputs. At the outputs of nine flip-flops, pseudo-random numbers of a period $2^9-1=511$ are generated. As pseudo-random numbers, five bits R[4] through R[8] out of the nine bits are used. F[4] through F[8] are supposed to be signals a half cycle earlier each than R[4] through R[8].

Figure 14:
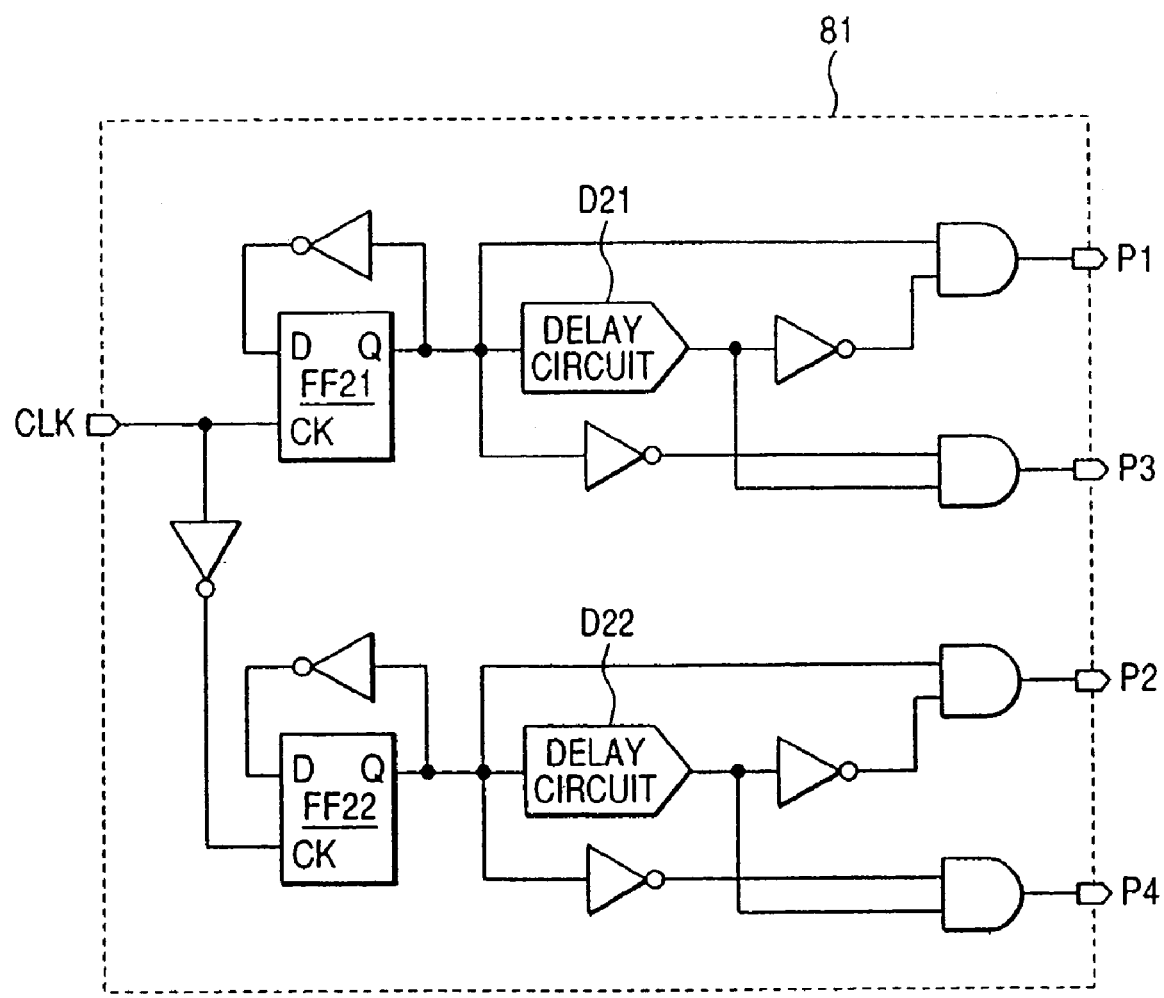
FIG. 14 is a logical circuit diagram showing an example of logical configuration of the one-shot pulse generator circuit of FIG. 12.

FIG. 14 shows an example of logical configuration of the one-shot pulse generator circuit 81 of FIG. 12. Reference signs FF21 and FF22 denote D flip-flops operating at the leading edge of the clock input (CK). Signs D21 and D22 denote delay circuits. Signs P1, P2, P3 and P4 denote output signals. Sign P1 denotes the leading edge of an odd-number cycle of the clock CLK, P2 denotes the trailing edge of the odd-number cycle of the clock CLK, P3 denotes the leading edge of an even-number cycle of the clock CLK, and P4 denotes the trailing edge of the even-number cycle of the clock CLK, each staying at a high level for a prescribed length of time (the delay time by D21 or D22).

Figure 15:
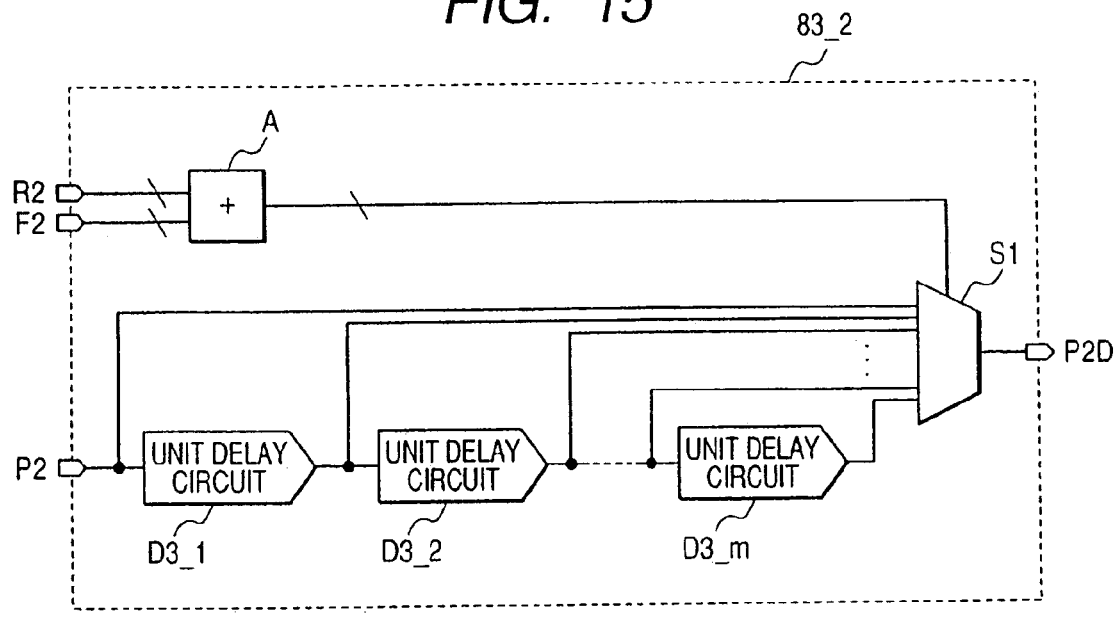
FIG. 15 is a logical circuit diagram showing an example of logical configuration of the variable delay circuit of FIG. 12.

FIG. 15 shows an example of logical configuration of the variable delay circuit 83_2 of FIG. 12. Other variable delay circuits 83_1, 83_3 and 83_4 have the same configurations. Reference sign A denotes an adding circuit, D3_1 through D3_m, unit delay circuits, S1 denotes a selector, and R2 and F2 denote control signals of a plurality of bits each. Out of signals obtained by having an input signal P2 pass m unit delay circuits D3_1 through D3_m, the (R+F)-th one is selected with the selector S1 to provide an output P2D. The delay time is td(R+F), where td represents the delay time of a unit delay circuit.

The (R+F)-th control signal supplied to the selector S1 is generated by an adding circuit A. P2 and P4 define the trailing edge of the clock RCLK and, in order not to let this trailing edge emerge at a timing earlier than the leading edge defined by P1 and P3, P2D (P4D) uses the sum (in effect the average) of R2 and F2, the value a half cycle before R2, as the control signal of the selector S1 for P2 (P4). No such consideration is needed for P1 and P3 because they define the leading edge of the clock RCLK, and the adding circuit A uses the value of R1+R1 (R3+R3) as the control signal for the selector S1. In short, as the two sets of control signals are the same signals, simple one-bit shifting would be sufficient for the variable delay circuits 83_1 and 83_3 without needing the adding circuit A.

Figure 16:
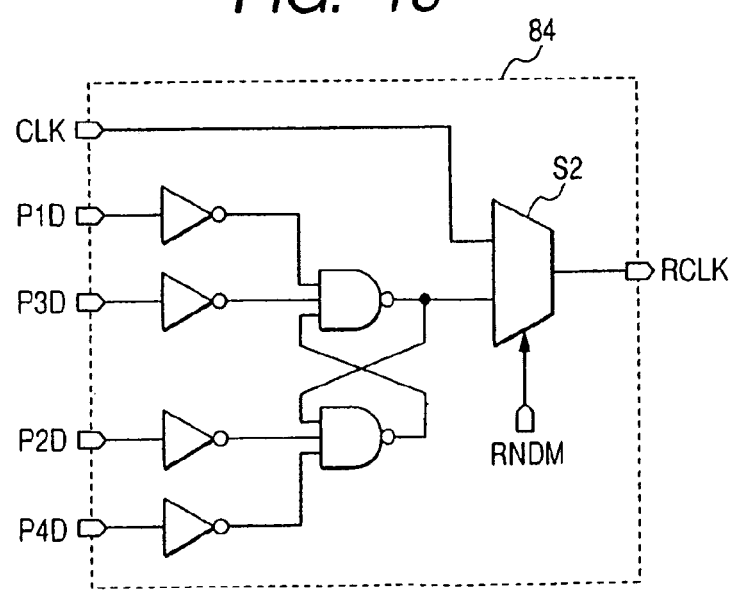
FIG. 16 is a logical circuit diagram showing an example of logical configuration of the clock synthesizer circuit of FIG. 12.

FIG. 16 shows an example of logical configuration of the clock synthesizer circuit 84 of FIG. 12. Reference sign S2 denotes a selector, and RNDM denotes a phase randomization enable signal. When RNDM is at a high level, the output RCLK rises to a high level at the timing of P1D rising to a high level, falls to a low level at the timing of P2D rising to a high level, rises to a high level at the timing of P3D rising to a high level, and falls to a low level at the timing of P4D rising to a high level. When RNDM is at a low level, the input clock CLK becomes the output clock RCLK as it is. Namely, no phase randomization takes place.

Figure 17:
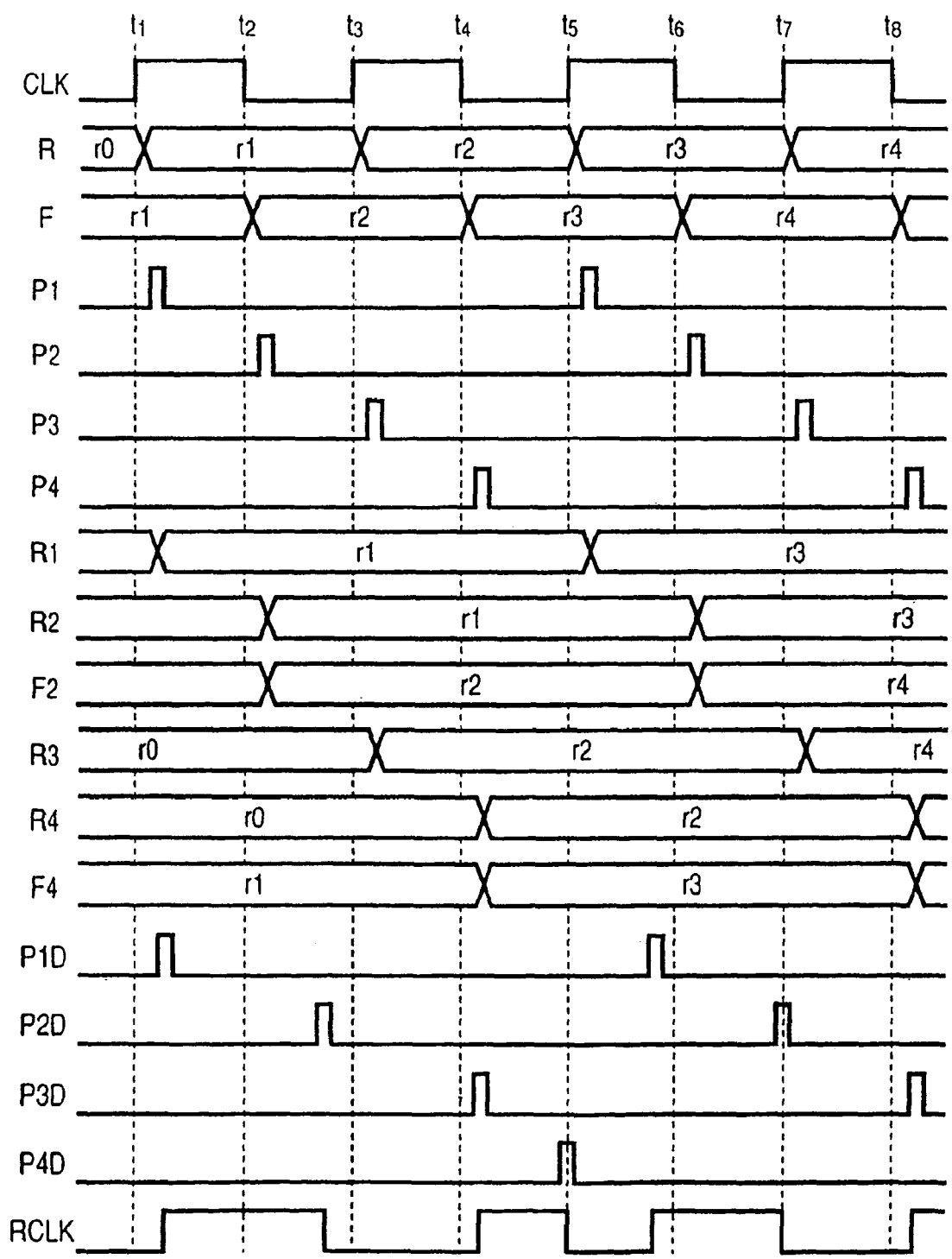
FIG. 17 is a timing chart showing the operational waveform of the phase randomizer circuit FIG. 12.

FIG. 17 shows the operational waveform of the phase randomizer circuit 8 of FIG. 12. At every leading edge (t1, t3, t5, . . . ) of the clock CLK, a new pseudo-random number R is generated (r1, r2, r3, . . . ). The pseudo-random number F varies earlier than that, namely at the trailing edge of CLK.

The one-shot pulse P1 stays at a high level from the leading edge (t1, t5, . . . ) of each odd-number cycle of CLK, P2 from the trailing edge (t2, t6, . . . ) of each odd-number cycle of CLK, P3 from the leading edge (t3, t7, . . . ) of each even-number cycle of each odd-number cycle of CLK, and P4 from the trailing edge (t4, t8, . . . ) of each even-number cycle of CLK, each for a prescribed length of time.

The output R1 of the latch circuit 82_1 varies when P1 rises to a high level. Thus it becomes r1 at time t1, to r3 at t5, and so on. Each of the outputs R2 and F2 of the latch circuit 82_2 varies when P2 rises to a high level. Thus they respectively become r1 and r2 at time t2, r3 and r4 at t6, and so forth. The output R3 of the latch circuit 82_3 varies when P3 rises to a high level. Thus it becomes r2 at time t3, r4 at t7 and so forth. Each of the outputs R4 and F4 of the latch circuit 82_4 varies when P4 rises to a high level. Thus they respectively become r2 and r3 at time t4, r4 and r5 at t8 and so forth.

The output P1D of the variable delay circuit 83_1 becomes a pulse resulting from the delaying of P1 by td (2□R1). The output P2D of the variable delay circuit 83_2 becomes a pulse resulting from the delaying of P2 by td (R2+F2). The output P3D of the variable delay circuit 83_3 becomes a pulse resulting from the delaying of P3 by td (2□R3). The output P4D of the variable delay circuit 83_4 becomes a pulse resulting from the delaying of P2 by td (R4+F4).

The output RCLK rises to a high level at the timing of P1D rising to a high level, falls to a low level at the timing of P2D rising to a high level, rises to a high level at the timing of P3D rising to a high level, and falls to a low level at the timing of P4D rising to a high level. Therefore, the leading edge at time t1 of CLK is delayed by td (2□r1), the trailing edge at t2, by td (r1+r2), the leading edge at t3, by td (2□r2), and the trailing edge at t4, by td (t2+t3).

The phase randomizer circuit 8 makes the delay time of a given trailing edge the average of the delay times of the leading edges immediately before and after it. Therefore, even if the maximum delay time is set considerably long, neither the high level period nor the low level period of RCLK will be lost. Theoretically, the maximum delay time can be set equal to the period of CLK.

Figure 18:
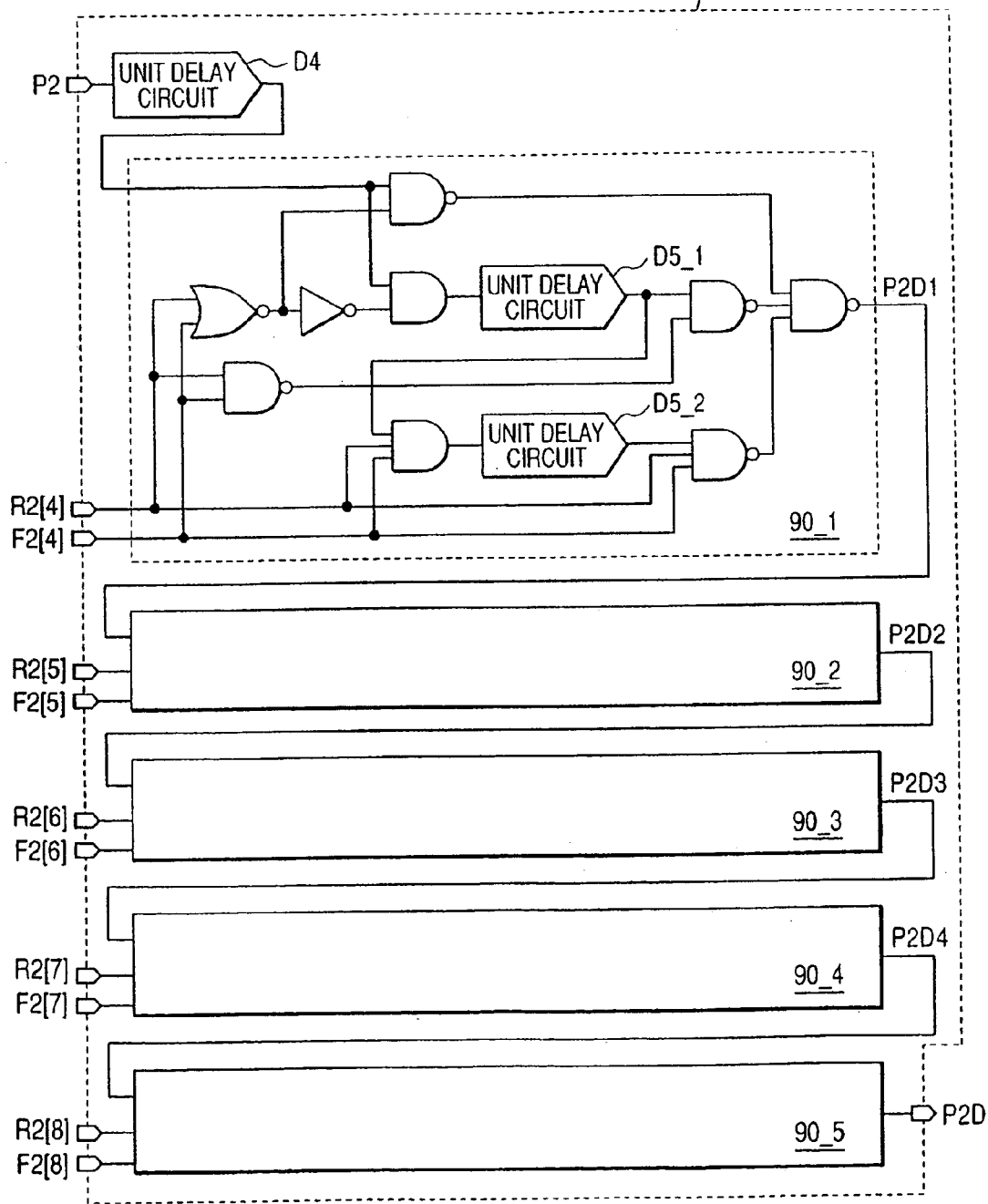
FIG. 18 is a logical circuit diagram showing another example of the variable delay circuit of FIG. 12.

FIG. 18 shows another example of the variable delay circuit 83_2 (83_1, 83_3 or 83_4) of FIG. 12. In FIG. 18, reference sign D4 denotes a delay circuit and 90_1 denotes a unit variable delay circuit. This circuit has two unit delay circuits D5_1 and D5_2. When both control signals R2[4] and F2[4] are at a low level, an input signal P2D0 is supplied without passing the unit delay circuit. When either one of R2[4] and F2[4] is at a high level, the input signal is supplied passing only D5_1 or when both R2[44] and F2[4] are at a high level, passing both D5_1 and D5_2. Reference numeral 90_2, 90_3, 90_4 and 90_5 also denote unit variable delay circuits having a similar circuit configuration to 90_1. In this way, depending on the combination of two bits each matching five-bit R2 and F2, which can be one of three sets including (high level and high level), (high level and low level) and (low level and low level), one out of three delay times is selected, with the result that one out of 32 different delay times can be selected to generate P2D for P2. The delay time of each unit delay circuit is set to be double that of 90_1 for 90_2, four times the same for 90_3, eight times the same for 90_4, and 16 times the same for 90_5.

The delay time from the input P2 to the output P2D, the delay times of logic gates being ignored, can be represented by td{(R2[4]+F2[4])+2 (R2[5]+F2[5])+4(R2[6]+F2[6])+8 (R2[7]+F2[7])+16 (R2[8]+F2[8])}+td4, where td is the delay time of the unit delay circuit D5_1 or D5_2 and td4 is the delay time of the delay circuit D4.

The role of the delay circuit D4 is to let the input pulse P2 pass the unit variable delay circuits after the setting of delay times according to the control signals R[4] through R[8] and F[4] through F[8] is completed.

The circuit configuration of FIG. 18 has an advantage of smaller circuit dimensions than the circuit of FIG. 15 because it does not need the adding circuit A.

Figure 19:
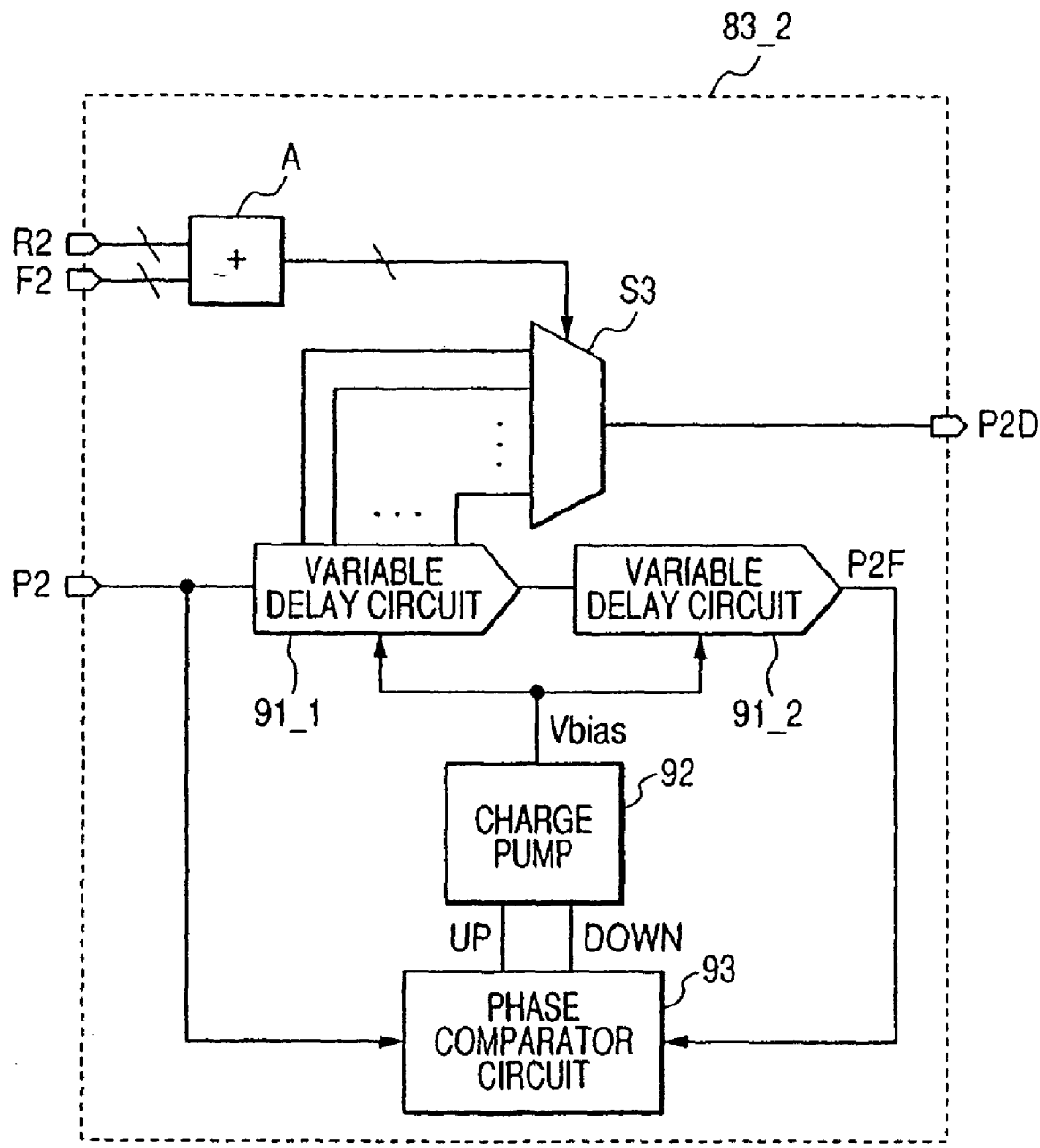
FIG. 19 is a logical circuit diagram showing still another example of the variable delay circuit of FIG. 12.

FIG. 19 shows still another example of the variable delay circuit 83_2 (83_1, 83_3 or 83_4) of FIG. 12. Reference sign A denotes an adding circuit, S3 denotes a selector, and 911 and 912 denote variable delay circuits. Although this is a circuit consisting of a plurality of unit delay circuits in cascade, the delay time of each unit delay circuit can be controlled by varying the bias voltage Vbias. Reference numeral 92 denotes a charge pump circuit, which steps up or down Vbias in accordance with the instruction of an up signal UP and a down signal DOWN. Reference numeral 93 denotes a phase comparator circuit, which compares the phase of P2 and that of a signal P2F resulting from the passage of P2 through the variable delay circuits 91_1 and 92_2. If P2F is behind P2, this circuit will raise Vbias by supplying the signal UP and shorten the delay times of the variable delay circuits 91_1 and 92_2. If P2F is ahead of P2, it will lower Vbias by supplying the signal DOWN and extend the delay times of the variable delay circuits 91_1 and 92_2.

The variable delay circuits 91_1 and 91_2, the charge pump 92 and the phase comparator circuit 93 can be implemented in a circuit configuration similar to what is used in, for instance, an analog delay-locked loop (DLL) circuit.

The operating principle of the circuit of FIG. 19 is similar to that of the circuit of FIG. 15 except that the delay time can be controlled with Vbias. An advantage of the circuit configuration of FIG. 19 consists in that the maximum length of the delay time from the input P2 to the output P2D can be set equal to the period of CLK even if the period of the clock CLK, voltage or temperature varies or if there is any process fluctuation. If the phase of P2 and that of P2D are equal, the total of the delay times of 91_1 and 92_2 will be twice as long as the period of CLK. Therefore, the maximum length of the delay time from P2 to P2D, namely the delay time of 91_1 is equal to the period of CLK.

Since the variable delay circuit 91_2, the charge pump 92 and the phase comparator circuit 93 are circuits provided for measuring the period of the clock CLK, the four variable delay circuits 83_1 through 83_4 of FIG. 12 can be commonly used for this purpose. The generated bias voltage Vbias could then be distributed to the variable delay circuits 83_1 through 83_4.

Figure 20:
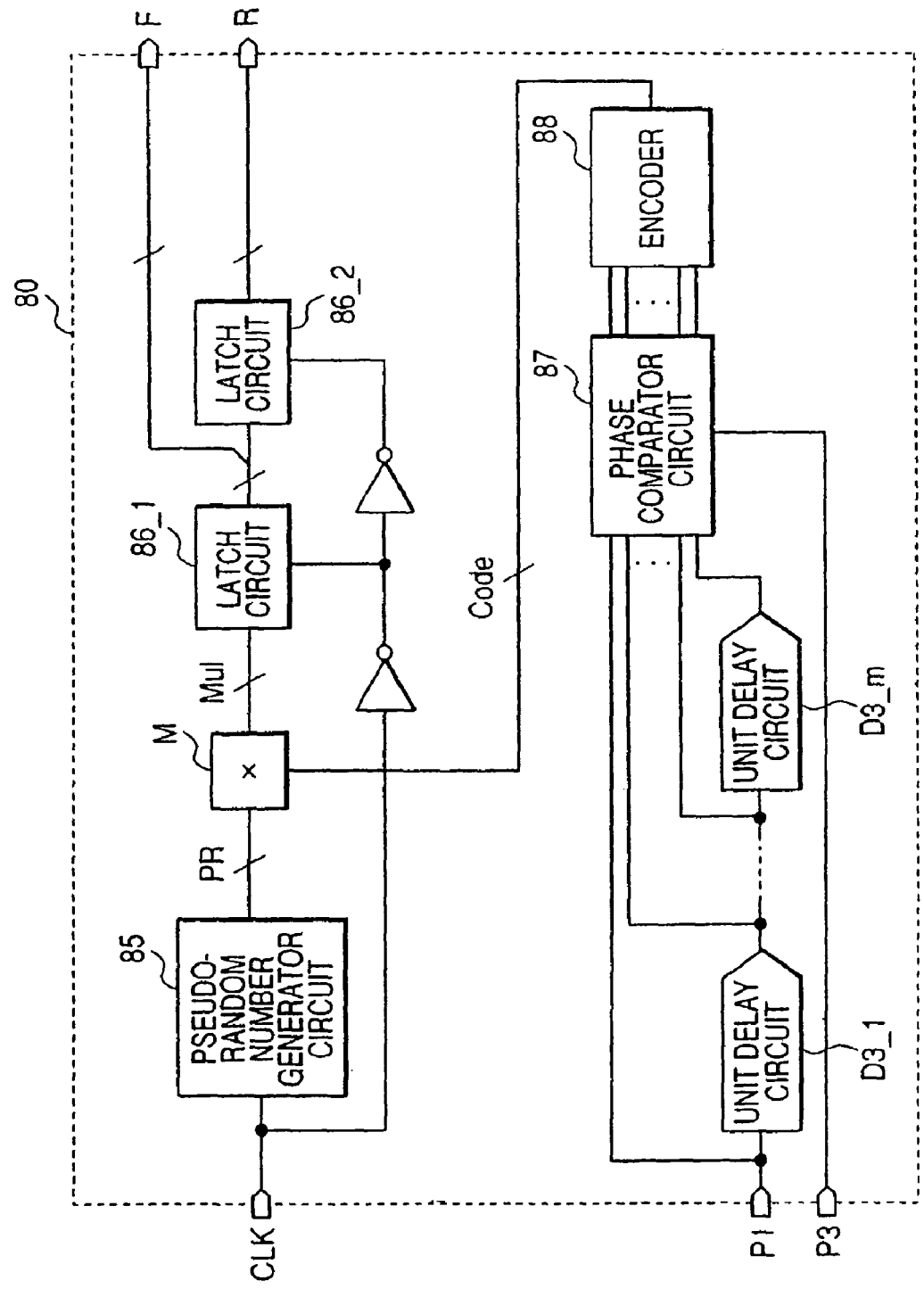
FIG. 20 is a logical circuit diagram showing yet another example of the pseudo-random number generator circuit of FIG. 12.

FIG. 20 shows yet another example of the pseudo-random number generator circuit 80 of FIG. 12. Reference numeral 85 denotes a pseudo-random number generator circuit, which can be implemented with what is similar to the circuit of FIG. 13. However, F[4] through F[8] need not be supplied, and accordingly L4 through L8 are not required. Reference sign M denotes a multiplying circuit, and 86_1 and 86_2 denote latch circuits. Signs D3_1 through D3_*m* denote unit delay circuits, which are the same as D3_1 through D3_*m* of FIG. 15. Numeral 87 denotes a phase comparator circuit, which compares the phase of signals resulting from the delaying of the pulse P1 by D3_1 through D3_*m* with that of P3. Numeral 88 denotes an encoder, which encodes the output of the phase comparator circuit and supplies the encoded output as a code Code. The code Code actually consists of a plurality of bits.

When P3 is in phase with a signal resulting from the passage of unit delay circuits k times by Ps, Code is equal to k. This is in essence because there is a lag by one clock period between P1 and P3. What results from the multiplication of Code=k by a pseudo-random number PR and picking up only its more significant bits is Mul. Mul is a pseudo-random number whose value is never greater than k. Signals R and F resulting from its latching are the output.

The circuit configured as shown in FIG. 20, like the circuit of FIG. 19, allows setting of the maximum length of the delay time equal to the period of CLK even if the period of the clock CLK, voltage or temperature varies or if there is any process fluctuation. The reason is that Code=k means that the phase difference between P1 and P3, namely the period of CLK, is equal to k unit delay circuits, and this in turn means that the maximum length of the delay time of the variable delay circuit 83_1 through 83_4 of FIG. 12 is k times the unit delay time, namely the period of CLK.

Figure 21:
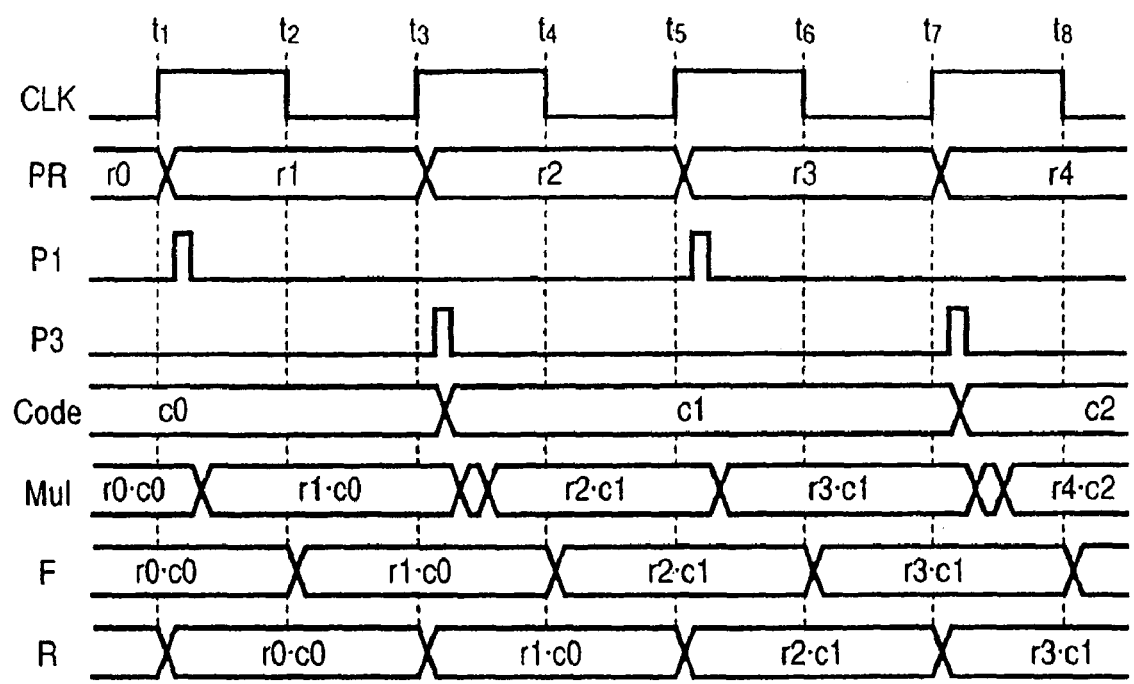
FIG. 21 is a timing chart showing the operational waveform of the pseudo-random number generator circuit of FIG. 20.

FIG. 21 shows the operational waveform of the pseudo-random number generator circuit 80 of FIG. 20. The circuit 85 generates a new pseudo-random number PR (r1, r2, r3, . . . ) at each leading edge (t1, t3, t5, . . . ) of the clock CLK. On the other hand, the output Code of the encoder varies every time the pulse P3 rises to a high level (c1, c2, . . . ). The output Mul of the multiplying circuit varies at t1, t3, t5, . . . ; the output F results from latching this output at the trailing edge (t2, t4, t6, . . . ) of CLK, and the output R results from further latching the output F at the leading edge (t3, t5, t7, . . . ) of CLK.

The pseudo-random number generator circuit 80 of FIG. 20 has an advantage of quick response to variations in the period of the clock CLK, voltage or temperature. The reason is that the signal Code representing the period of the clock CLK is updated at every second cycle.

Figure 22:
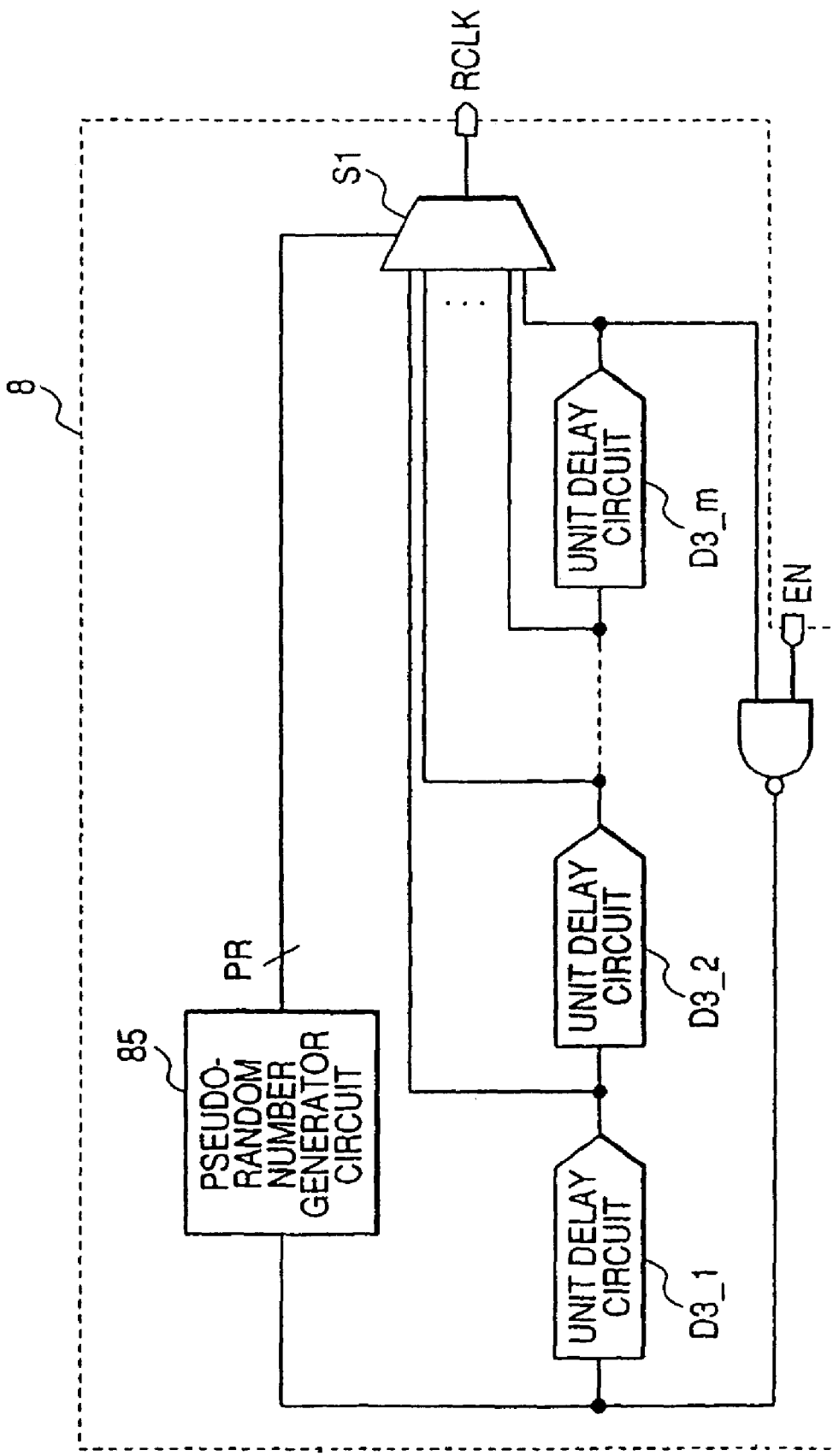
FIG. 22 is a logical circuit diagram showing another example of the phase randomizer circuit of FIG. 11.

FIG. 22 shows another example of the phase randomizer circuit 8 of FIG. 11. A feature of this example is that there is no clock input, but clocks are generated by self-oscillation inside. Thus, clocks are generated by a ring oscillator composed of m unit delay circuits D3_1 through D3_m and a NAND gate NAND. By selecting at random one of the m outputs with the selector S1, the phase of the clocks is randomized. Reference sign EN denotes an enable signal, and self-oscillation is accomplished by raising this signal to a high level.

Figure 23A:
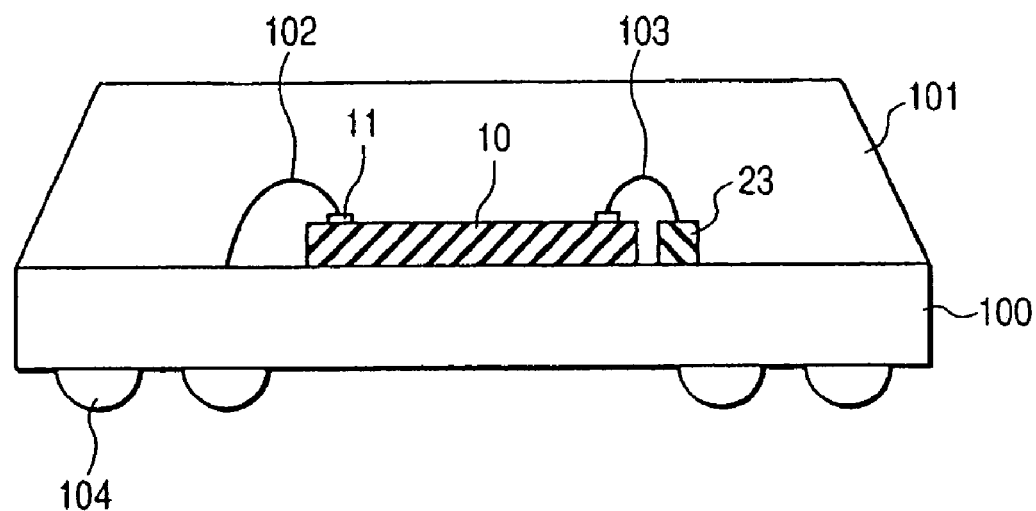
FIG. 23A is a vertical section showing a first example of sealing a semiconductor integrated circuit having on chip the step-down circuit according to the present invention into the same package together with a capacitor.
Figure 23B:
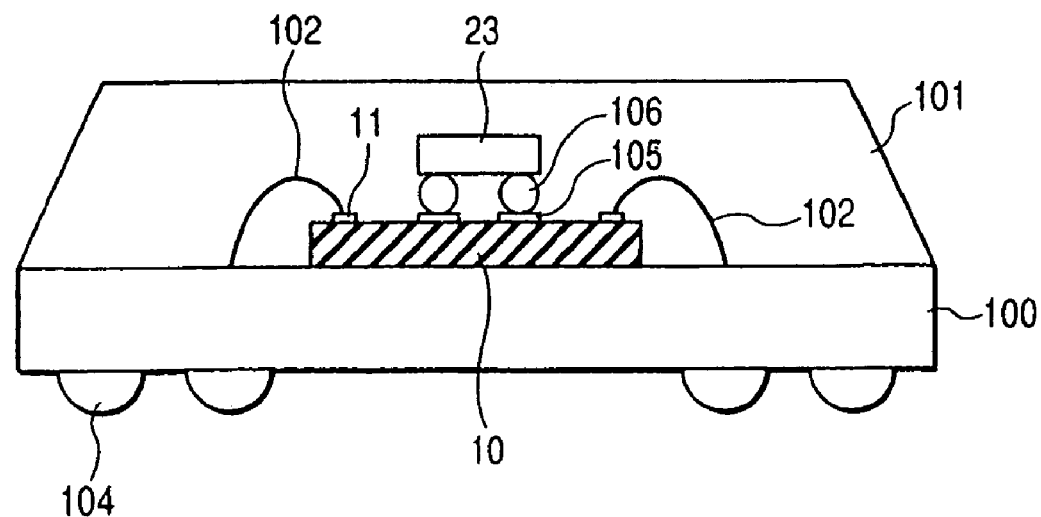
FIG. 23B is a vertical section showing a second example of sealing a semiconductor integrated circuit having on chip the step-down circuit according to the present invention into the same package together with a capacitor.

FIG. 23A and FIG. 23B show examples of sealing a semiconductor integrated circuit having on chip the step-down circuit according to the present invention into the same package together with a capacitor. Circuit elements having counterparts, either exact or substantial, in FIG. 7 or FIG. 8 are assigned respectively the same reference signs. In the configuration shown in FIG. 23A, the LSI chip 10 and the capacitors 23 are arranged adjacent to each other and connected by a bonding wire 103 to each other. In the configuration shown in FIG. 23B, the capacitors 23 are mounted over pads 105 provided on the LSI chip 10 with solder balls 106 in-between. Reference numeral 23 covers all of the capacitors 23_0 through 23_4 of FIG. 8. Numeral 100 denotes a wiring board such as a multi-layered wiring board, and 101 denotes molded resin. By use of the sealing structure illustrated in this drawing, the need to mount the capacitor on a board 20 is eliminated, and the mounting area of the board 20 can be reduced accordingly. The capacitors 23 to be sealed into the packet need not be all of the capacitors 23_0 through 23_4. For instances, only the capacitors 23_1 through 23_4 would suffice.

Figure 24A:
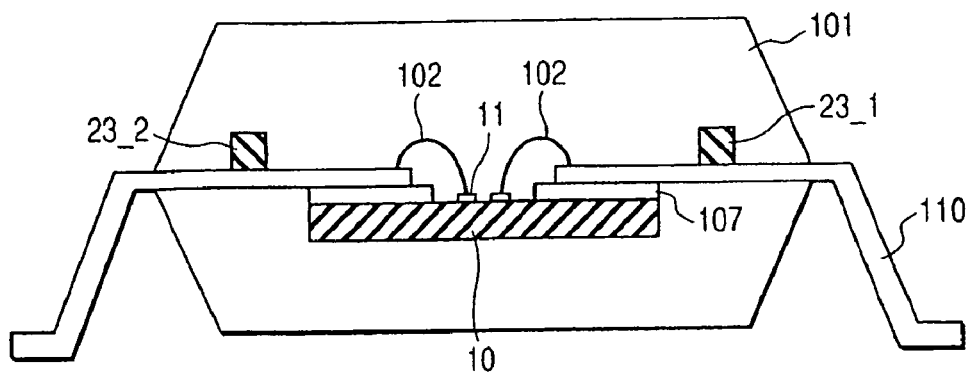
FIG. 24A is a vertical section showing an example of mounting and resin-sealing capacitors over lead terminals together with a semiconductor integrated circuit having on chip the step-down circuit according to the present invention.
Figure 24B:
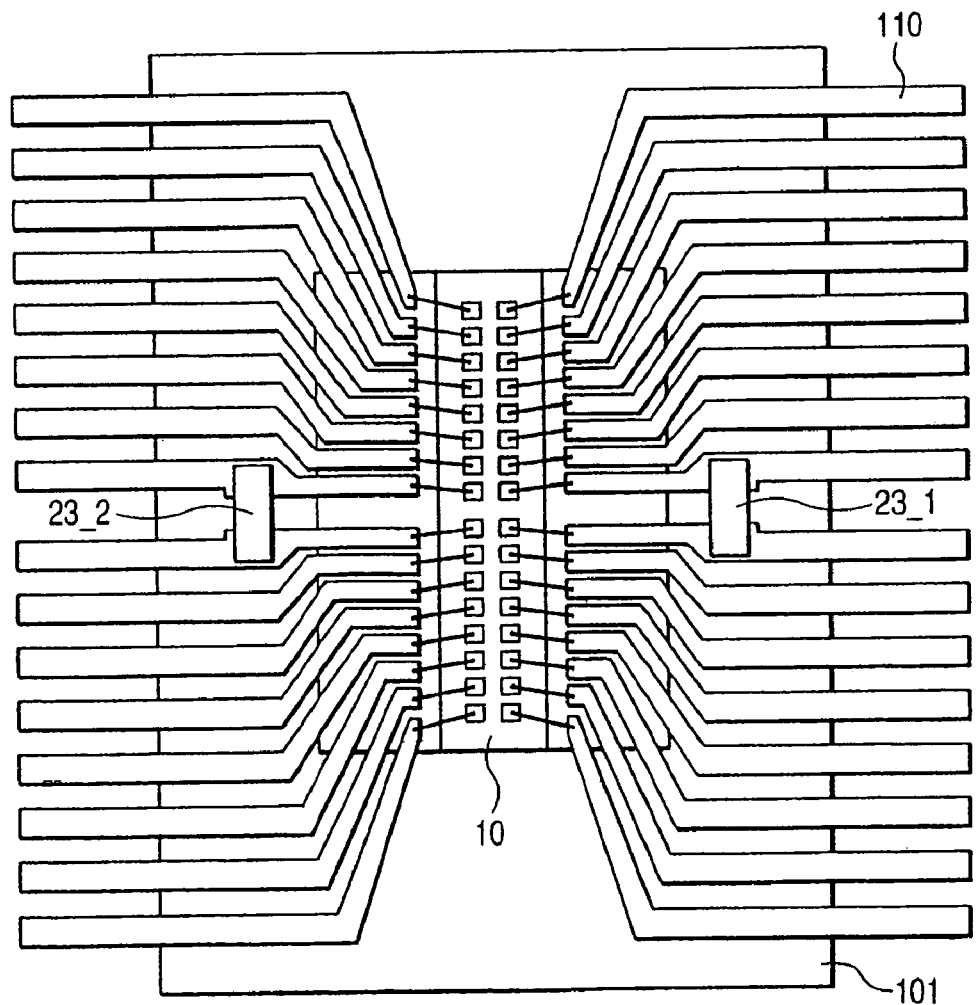
FIG. 24B is a plan of what is illustrated in FIG. 24A.

FIG. 24A and FIG. 24B show an example of mounting capacitors over lead terminals. FIG. 24A shows a vertical section, and FIG. 24B shows a plan. Here the step-down circuit is supposed to have two switch arrays 5_1 and 5_2. Reference numerals 23_1 and 23_2 denote capacitors to be connected to pads CPi and CMi shown in FIG. 7. Numeral 107 denotes an insulating tape, and 110 denotes a lead. This configuration can also help reduce the mounting area over the board 20. Where the configuration of FIG. 24A and FIG. 24B is to be used, it is preferable for the bonding pads CPi and CMi for externally connecting the capacitors to be adjacent to each other. Their adjacent arrangement not only would facilitate mounting but also could help reduce the parasitic inductance.

It is not absolutely necessary for the capacitors of the switched capacitor type step-down circuit to be capacitors 23 (23_1 and 23_2) external to the LSI chip 10. Though not shown in particular, they may be on-chip capacitors of the LSI chip 10. Each of the on-chip capacitors may be composed of an MOS capacitance of which one capacitance electrode consists of the gate electrode of an MOS transistor and the other consists of a common source-drain, or a capacitance using polysilicon or the like for electrodes.

Figure 25:
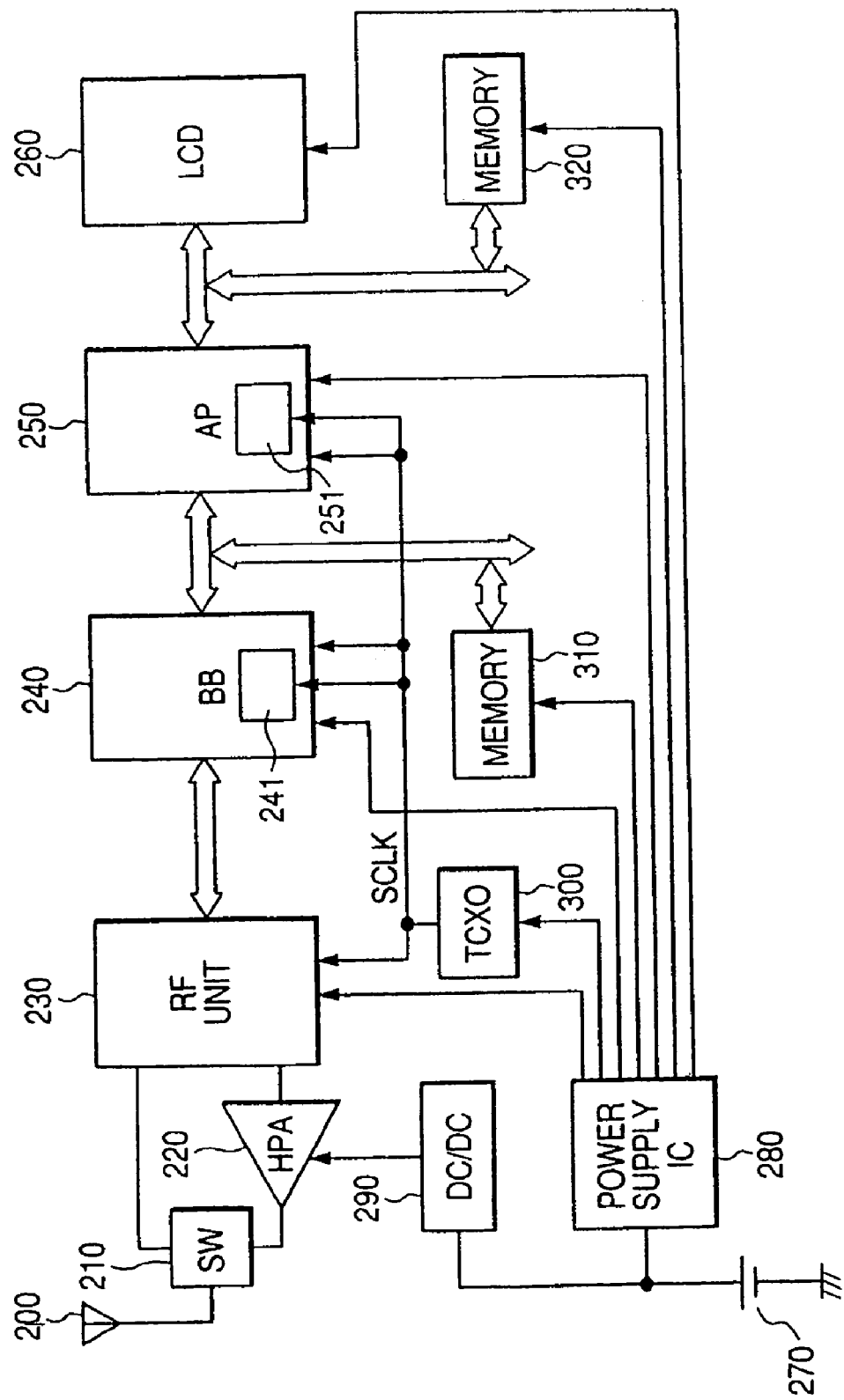
FIG. 25 is a block diagram showing an example of logical configuration of a cellular phone using a semiconductor integrated circuit having the step-down circuit according to the present invention.

FIG. 25 shows an example of logical configuration of a cellular phone using a semiconductor integrated circuit having the step-down circuit according to the present invention. Step-down circuits 241 and 251 are mounted on an application processor 250 and a base band unit 240. Reference numeral 200 denotes an antenna, 210 denotes a transmission/reception switch-over circuit, 220 denotes an amplifier for transmission use (high power amplifier), 230 denotes a radio frequency unit, 240 denotes a base band unit, and 250 denotes an application processor. Numeral 241 denotes a step-down circuit built into the base band unit 240, and 251 denotes a step-down circuit built into the application processor 250. Numeral 260 denotes a liquid crystal display unit, 270 denotes a lithium battery, and 280 denotes a power supply IC. The power supply IC 280 is configured of, for instance, a series type step-down circuit. Numeral 290 denotes a DC/DC converter, 300 denotes a clock generator, and 310 and 320 denote memories, for instance a flash memory and an SRAM.

A system clock SCLK generated by the clock generator 300 is supplied to the radio frequency unit 230, the base band unit 240 and the application processor 250 as the system clock. The step-down circuit 251 mounted on the application processor 250 operates the switched capacitor type step-down circuit by use of this system clock. Thus, the step-down circuit 251 operates at the same frequency as the base band unit and the application process. This causes noise resulting from the operation of the step-down circuit 251 to have the same frequency as that arising from the base band unit and the application processor, and accordingly there is no particular need for the randomization of the clock phase as shown in FIG. 11.

When the application processor is not operating, the supply of the clock SCLK is also suspended. This prevents the switched capacitor type step-down circuit from operating, but the series type step-down circuit connected in parallel enables the output voltage to be held. The same is true of the step-down circuit 241 mounted on the base band unit.

Examples of calculation of the efficiency of power conversion from the battery 270 to the output of the step-down circuit 251 and the service life of the battery will be explained below. First, the following suppositions are made: the output of the lithium battery 270=3.7 V, the capacity of the lithium battery=600 mAh, the output of the power supply IC 280=2.8 V, the output of the step-down circuit 251=1.0 V, the current consumption of the application processor=200 mA, and other LSIs are in a standby state (current consumption is close to 0).

If the series type step-down circuit is used alone without applying the present invention, the power conversion efficiency will be 1.0/3.7=27%, the output current of the battery will be 200 mA, and the life of the battery will be 3 hours.

If the present invention is used (the efficiency of the switched capacitor type circuit is supposed to be 90%), the power conversion efficiency will be 1.0/3.7×2×90%=49%, the output current of the battery will be 200/2/90%=111 mA, and the life of the battery will be 5.4 hours. By use of the present invention, the life of the battery can be extended by 1.8 times.

Figure 26:
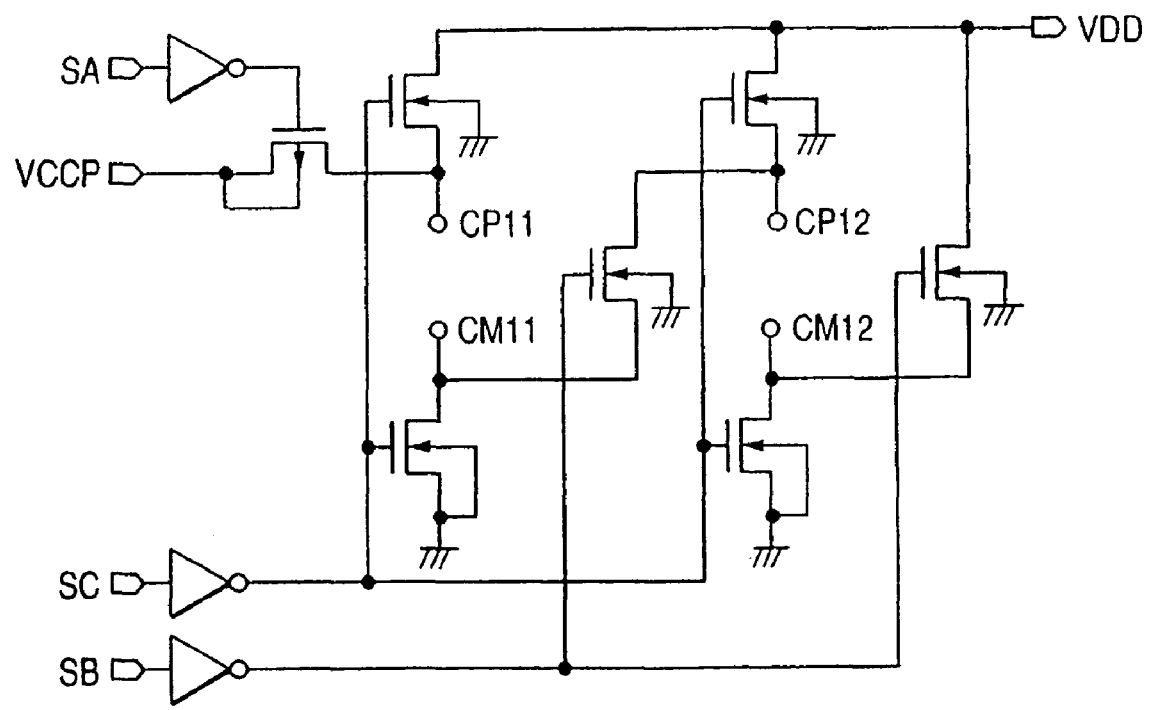
FIG. 26 is a circuit diagram showing the configuration of a switch array where the step-down ratio is 3:1.
Figure 27:
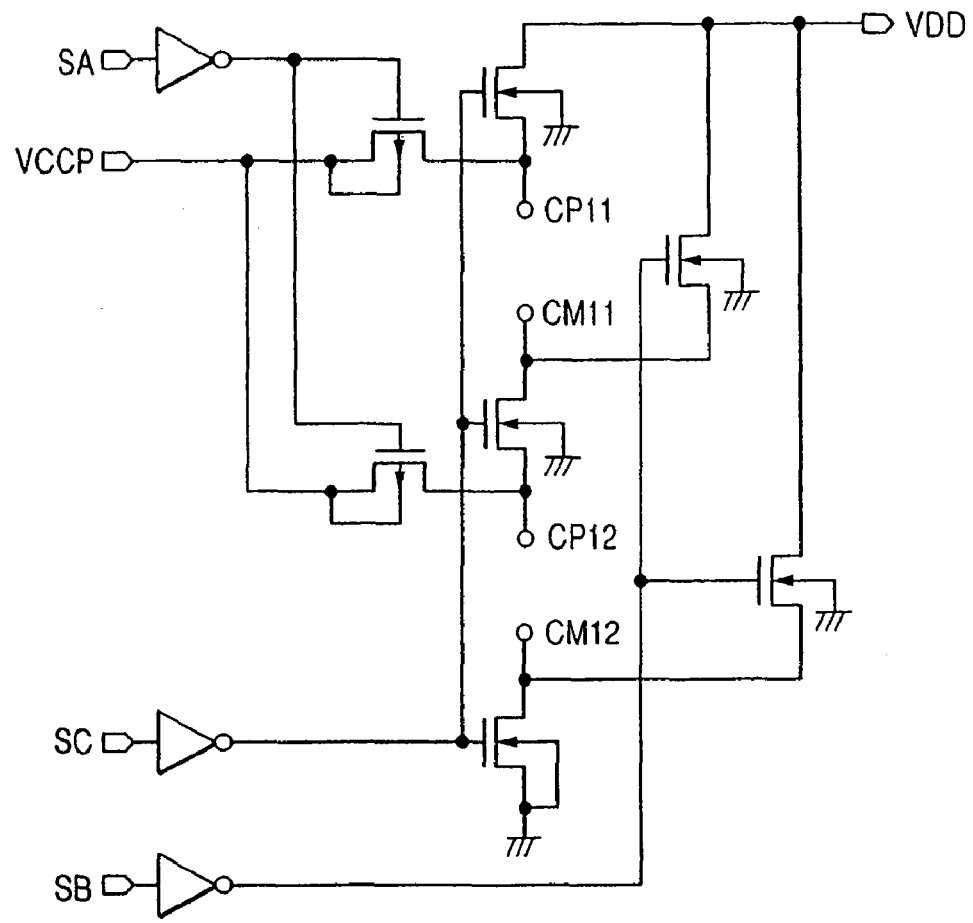
FIG. 27 is a circuit diagram showing the configuration of a switch array where the step-down ratio is 3:2.
Figure 33:
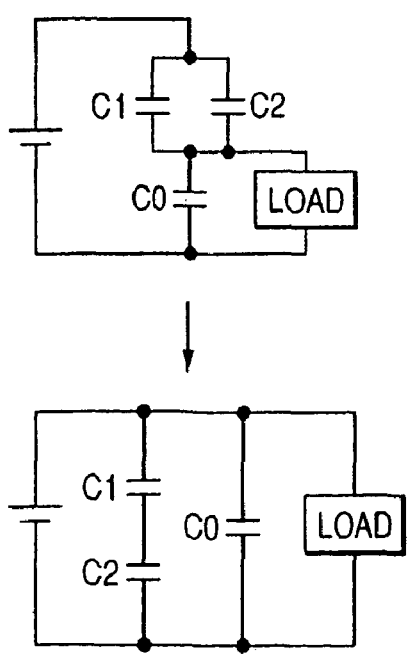
FIG. 33 is an equivalent circuit diagram showing the form of capacitance connection where a step-down ratio 2/3 is to be used in FIG. 27.

In the example of FIG. 2A, the step-down ratio is approximately 2:1. As other examples, a circuit diagram of a switch array in which the step-down ratio is 3:1 is shown in FIG. 26 and another in which the step-down ratio is 3:2 is shown in FIG. 27. Reference signs CP11, CM11, CP12 and CM12 denote terminals for externally connecting capacitors (switching capacitances). The operational waveform of control signals SA, SC and SB are the same as what are shown in FIG. 2B. Though not shown, where the step-down ratio is to be 1/3 in the circuit of FIG. 26, two switching capacitances and one smoothing capacitance can be connected in series and charged, followed by the connection of the three capacitances in parallel. Where the step-down ratio is to be 2/3 in the circuit of FIG. 27, as shown in FIG. 33 by way of example, at first the switching capacitances C1 and C2 can be connected in parallel, then connected in series to the smoothing capacitance C0 in series and charged, followed by the connection of the switching capacitances C1 and C2 in series, and the smoothing capacitance C0 can be connected in parallel to them.

Figure 29:
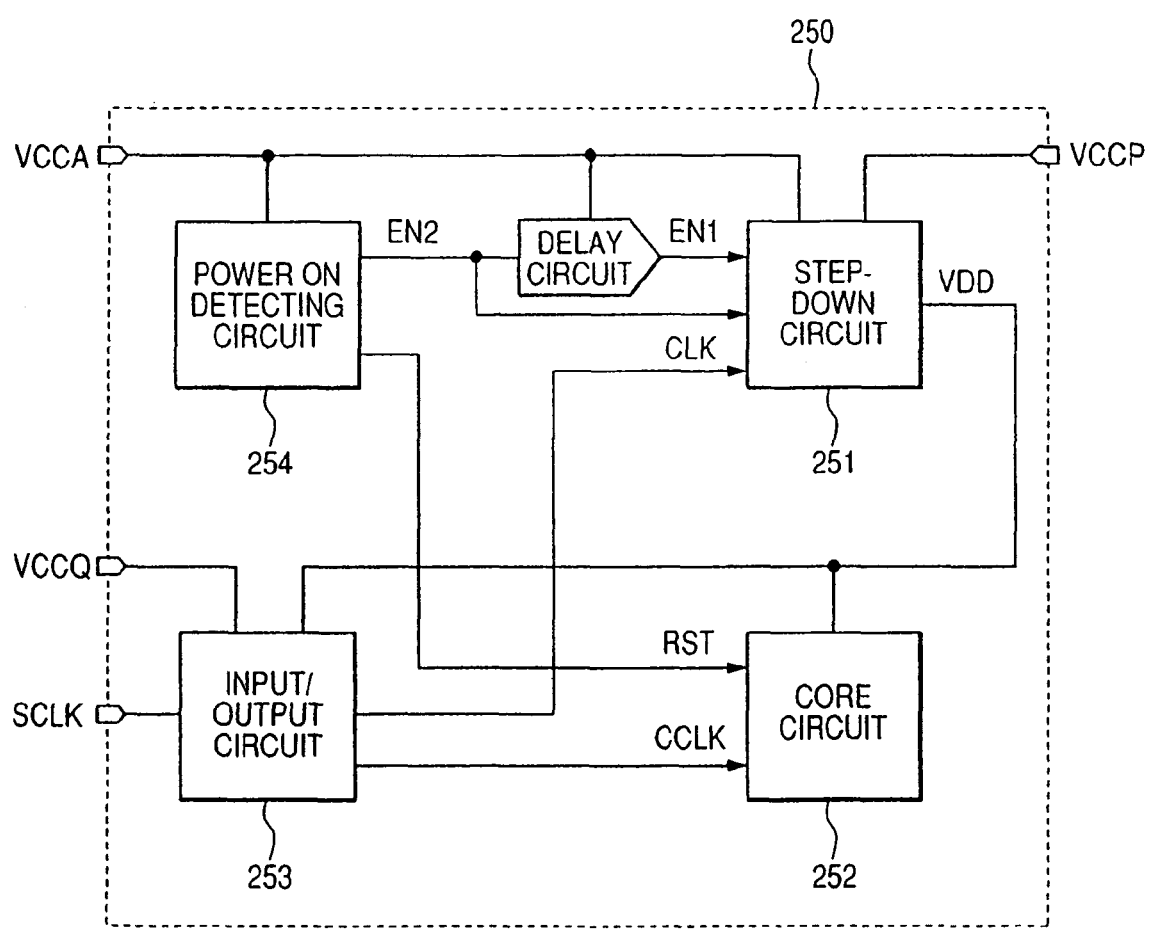
FIG. 29 is a block diagram showing an example of details of the application processor 250 of FIG. 25.

FIG. 29 shows an example of details of the application processor 250 of FIG. 25. Reference numeral 251 denotes a step-down circuit according to the present invention. Numeral 252 denotes the core circuit of the application processor 250, which works on a stepped-down power supply VDD as its operating power. Numeral 253 denotes an input/output circuit, which works on a power supply VCCQ for input/output circuit use as its operating power. The power supply VCCQ for input/output circuit use, though the same as VCCP and VCCA in voltage level, is separated in source from others to prevent power supply noise arising in the output circuit from propagating to other circuit parts. The input/output circuit 253 contains an input circuit for the system clock SCLK. In synchronism with the entered system clock SCLK, the clock CCLK (the voltage level is VDD) for the core circuit 252 and the clock CLK (the voltage level is VCCQ) for the step-down circuit 251 are supplied. Though the input/output circuit 253 of course is provided with input circuits and output circuits for other signals, too, their description is dispensed with here. Reference numeral 254 denotes a power ON detecting circuit for detecting the application of a power supply voltage. This detects the actuation of the power supply VCCA, and generates the reset signal RST for the core circuit 252 and the enable signal EN2 for the step-down circuit 251. By having the enable signal EN2 delayed by a delay circuit, an enable signal EN1 is generated.

Figure 31A:
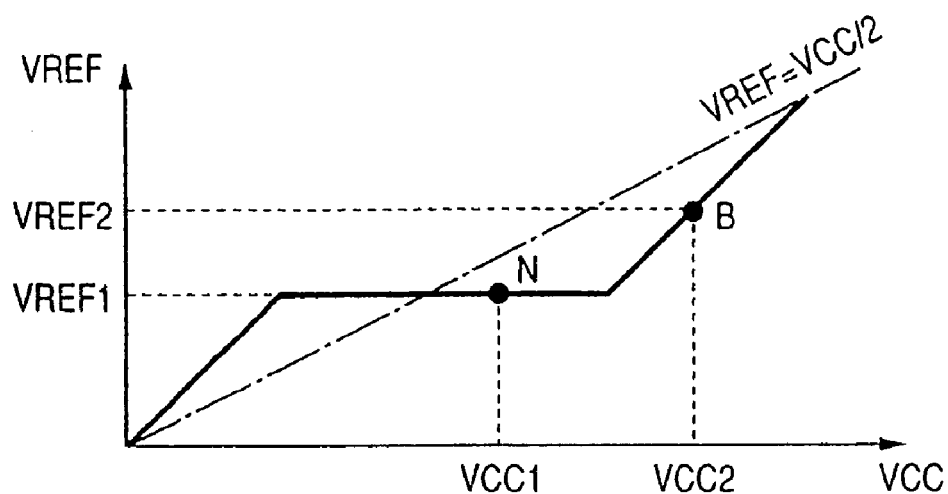
FIG. 31A illustrates a system that is used where a reference voltage is matched with a high voltage at the time of burn-in by causing the reference voltage, when the power supply voltage rises above the normal level, also to rise to follow it up.
Figure 31B:
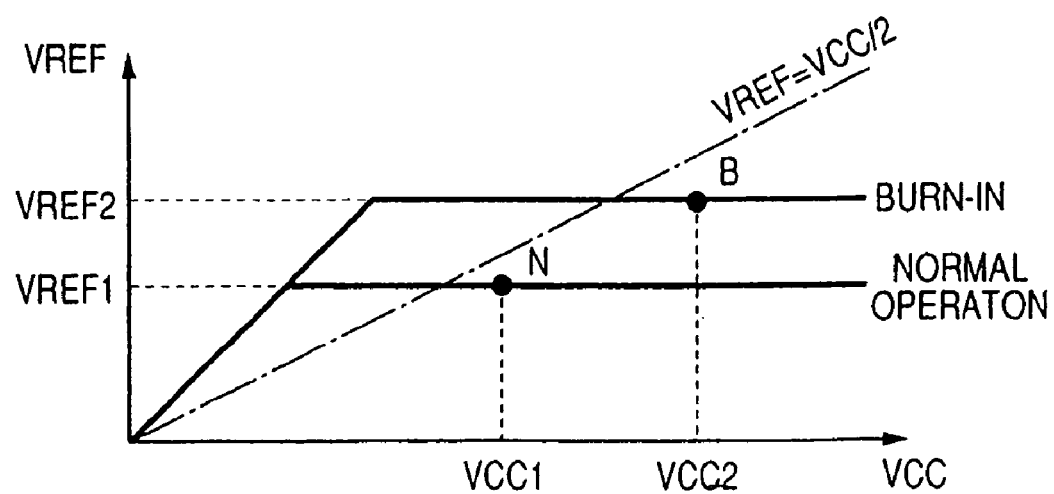
FIG. 31B illustrates a system that is used where a reference voltage is matched with a high voltage at the time of burn-in by switching the level of the reference voltage between a normal operation mode and a burn-in mode.

Techniques by which the output voltage VDD is set higher than normal when the semiconductor integrated circuit is to be burned in will be described below. This can be implemented by so setting the reference voltage VREF as to become higher at the time of burn-in. There are two methods available for its implementation as shown in FIG. 31A and FIG. 31B. In each graph, N denotes the operating point in normal operation (VCC=VCC1, VREF=VREF1), and B denotes the operating point in burn-in (VCC=VCC2, VREF=VREF2). It is adequate for both operating points N and B to be positioned below the straight line of VREF=VCC/2 (the one-dot chain lines in the graphs).

The first method of implementation is to stabilize VCC relative to VREF in normal operation. When VCC rises above the normal level, VREF is caused to rise correspondingly. This can be achieved by applying the technique described in U.S. Pat. No. 2,685,469. The second method of implementation is to change over the VREF level between the normal operation mode and the burn-in mode.

Figure 32:
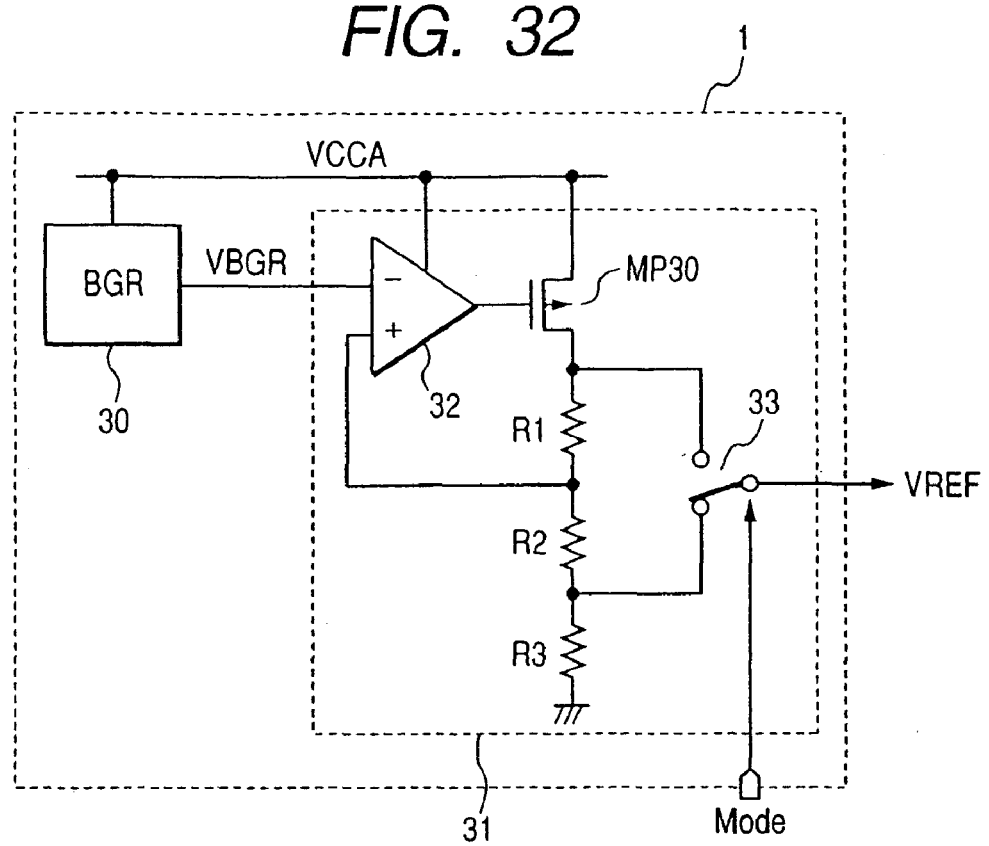
FIG. 32 is a circuit diagram showing an example of reference voltage generating circuit for implementing the technique illustrated in FIG. 31B.

FIG. 32 shows an example of reference voltage generating circuit 1 for implementing the technique illustrated in FIG. 31B. Reference numeral 30 denotes a band gap circuit, which generates a stable voltage VBGR not dependent on temperature or power supply voltage. Numeral 31 denotes a voltage level converting circuit. It comprises a differential amplifier 32, a P-channel MOS transistor MP30, resistances R1, R2 and R3, and a change-over switch 33, and generates the reference voltage VREF on the basis of a voltage VBGR. With a mode change-over signal Mode, it changes the tap position for taking out the reference voltage VREF.

While the present invention achieved by the present inventors has been hitherto described with reference to a specific embodiment thereof, the present invention is not limited to this embodiment. Obviously the present invention can be embodied in various other ways without deviating from its essentials.

For instance, where a plurality of switched capacitor type circuits are mounted on an LSI, they can be only partly operated according to the operating mode selected. The current consumption can be further reduced according to the operating mode. Or the current consumption can be optimized according to the operating mode.

It is also conceivable to mount a step-down circuit on one of the plurality of LSIs used in the system, and the voltage generated there can be supplied to other LSIs. This configuration can be applied with particular effectiveness to a multi-chip module (MCM) into which a plurality of LSI chips are sealed.

The present invention is applicable not only to semiconductor integrated circuits of a type integrated with a single circuit module, but also to other semiconductor devices, such as independent voltage converting ICs.

What is claimed is:

1. A semiconductor circuit device having a step-down unit formed over a semiconductor chip and configured to generate a stepped down voltage from a first external source voltage and a second reference voltage,
    wherein the semiconductor chip has a plurality of pairs of PADS each including a first PAD connected to the first external source voltage and a second PAD connected to the second reference voltage, and the step-down unit includes a switched capacitor step-down circuit and the switched capacitor step-down circuit includes a plurality of switch arrays, each switch array being arranged to be near to one of the pairs of PADs.

2. The semiconductor circuit device according to claim 1, further including a series regulator type step-down circuit and a step-down control circuit, and wherein a stepped-down voltage output terminal of the switched capacitor step-down circuit and a stepped-down voltage output terminal of the series regulator type step-down circuit are connected in common.

3. The semiconductor circuit device according to claim 2, further including a plurality of third PADs that are connected to a switching capacitance, the third PADs being arranged to be near to the switch arrays.

4. The semiconductor circuit device according to claim 3, wherein the third PADs are connected to a smoothing capacitance that is sealed into a package together with the semiconductor chip.

5. The semiconductor circuit device according to claim 4, wherein the semiconductor chip and the smoothing capacitance are arranged adjacent to each other, and wherein each of the third PADs and the smoothing capacitance are connected by a bonding wire.

6. The semiconductor circuit device according to claim 4, wherein the smoothing capacitance is mounted on the semiconductor chip.

7. The semiconductor circuit device according to claim 4, wherein the smoothing capacitance is mounted on lead terminals of the package.

* * * * *